US005841712A

United States Patent [19]
Wendell et al.

[11] Patent Number: 5,841,712
[45] Date of Patent: Nov. 24, 1998

[54] DUAL COMPARATOR CIRCUIT AND METHOD FOR SELECTING BETWEEN NORMAL AND REDUNDANT DECODE LOGIC IN A SEMICONDUCTOR MEMORY DEVICE

[75] Inventors: Dennis L. Wendell, Pleasanton; Benjamin S. Wong, Castro Valley, both of Calif.

[73] Assignee: Advanced Micro Devices, Inc., Sunnyvale, Calif.

[21] Appl. No.: 938,590

[22] Filed: Sep. 26, 1997

Related U.S. Application Data

[60] Provisional application No. 60/027,329, Sep. 30, 1996.

[51] Int. Cl.[6] ..................................................... G11C 7/00
[52] U.S. Cl. ................ 365/200; 365/185.09; 365/189.07
[58] Field of Search .............................. 365/200, 185.09, 365/185.11, 185.17, 189.07, 201, 230.03, 230.05

[56] References Cited

U.S. PATENT DOCUMENTS

| | | | |
|---|---|---|---|
| 4,939,694 | 7/1990 | Eaton et al. ............................. | 365/200 |
| 5,173,906 | 12/1992 | Dreibelbis et al. ..................... | 371/22.5 |
| 5,204,836 | 4/1993 | Reed ....................................... | 365/200 |
| 5,255,226 | 10/1993 | Ohno et al. ........................ | 365/189.12 |
| 5,313,424 | 5/1994 | Adams et al. ........................... | 365/200 |
| 5,337,318 | 8/1994 | Tsukakoshi et al. ..................... | 371/5.5 |
| 5,477,492 | 12/1995 | Ohsaki et al. ........................... | 365/200 |
| 5,493,531 | 2/1996 | Pascucci et al. ........................ | 365/200 |
| 5,498,886 | 3/1996 | Hsu et al. ............................... | 257/213 |
| 5,548,554 | 8/1996 | Pascucci et al. ........................ | 365/200 |
| 5,559,743 | 9/1996 | Pascucci et al. ........................ | 365/200 |
| 5,566,114 | 10/1996 | Pascucci et al. ........................ | 365/200 |
| 5,577,050 | 11/1996 | Bair et al. ............................... | 371/10.2 |
| 5,590,075 | 12/1996 | Mazzali .............................. | 365/185.22 |
| 5,602,786 | 2/1997 | Pascucci et al. ........................ | 365/200 |
| 5,642,316 | 6/1997 | Tran et al. .............................. | 365/200 |
| 5,659,509 | 8/1997 | Golla et al. ............................. | 365/200 |

OTHER PUBLICATIONS

B.F. Fitzgerald and D.R. Whittaker, *Semiconductor Memory Redundancy at the Module Level*, IBM Technical Disclosure Bulletin, vol. 23, No. 8, Jan. 1981, pp. 3601 & 3602.

Magdy S. Abadir and Hassan K. Reghbati, Functional Testing of Semiconductor Random Access Memories, *Computing Surveys*, vol. 15, No. 3, Sep. 1983, pp. 175–198.

Rob Dekker, Frans Beenker, and Loek Thijssen, Fault Modeling and Test Algorithm Development for Static Random Access Memories, *Proc. IEEE International Test Conference*, Sep. 1988, pp. 343–352.

Anthony J. McAuley and Charles J. Cotton, A Self–Testing Reconfigurable CAM, *IEEE Journal of Solid–State Circuits*, vol. 26, No. 3, Mar. 1991, pp. 257–261.

Tom Chen and Glen Sunada, A Self–Testing and Self–Repairing Structure for Ultra–Large Capacity Memories, *International Test Conference 1992*, pp. 623–631.

(List continued on next page.)

*Primary Examiner*—David C. Nelms
*Assistant Examiner*—Hien Nguyen
*Attorney, Agent, or Firm*—Skjerven, Morrill, MacPherson, Franklin & Friel, LLP; David W. O'Brien

[57] ABSTRACT

A redundancy circuit and method allows replacement of failed memory cells in a semiconductor memory array. Redundancy true and redundancy not comparator circuits are provided in dynamic logic to selectively enable and disable respective redundant row predecode and normal row predecode circuits. In one embodiment, redundancy circuits are row redundancy circuits. As compared with single static row redundancy comparator circuits which are limited by setup time constraints and which degrade access time irrespective of redundant row utilization, a dual dynamic comparator design reduces access time penalties when redundancy is enabled and eliminates access time penalties when redundancy is not required in a particular semiconductor memory array.

21 Claims, 25 Drawing Sheets

OTHER PUBLICATIONS

Akira Tanabe, et al., A 30–ns 64–Mb DRAM with Built–in Self–Test and Self–Repair Function, *IEEE Journal of Solid–State Circuits,* vol. 27, No. 11, Nov. 1992, pp. 1525–1531.

Vishwandi D. Agrawal, Charles R. Kime and Kewal K. Saluja, A Tutorial on Built–In Self–Test Part 1: Principles, *IEEE Design & Test of Computers,* Mar. 1993, pp. 73–82.

Vishwandi D. Agrawal, Charles R. Kime and Kewal K. Saluja, A Tutorial on Built–In Self–Test Part 2: Applications, *IEEE Design & Test of Computers,* Jun. 1993, pp. 69–77.

Robert Treuer and Vinod K. Agarwal, Built–In Self–Diagnosis for Repairable Embedded RAMs, *IEEE Design & Test of Computers,* Jun. 1993, pp. 24–33.

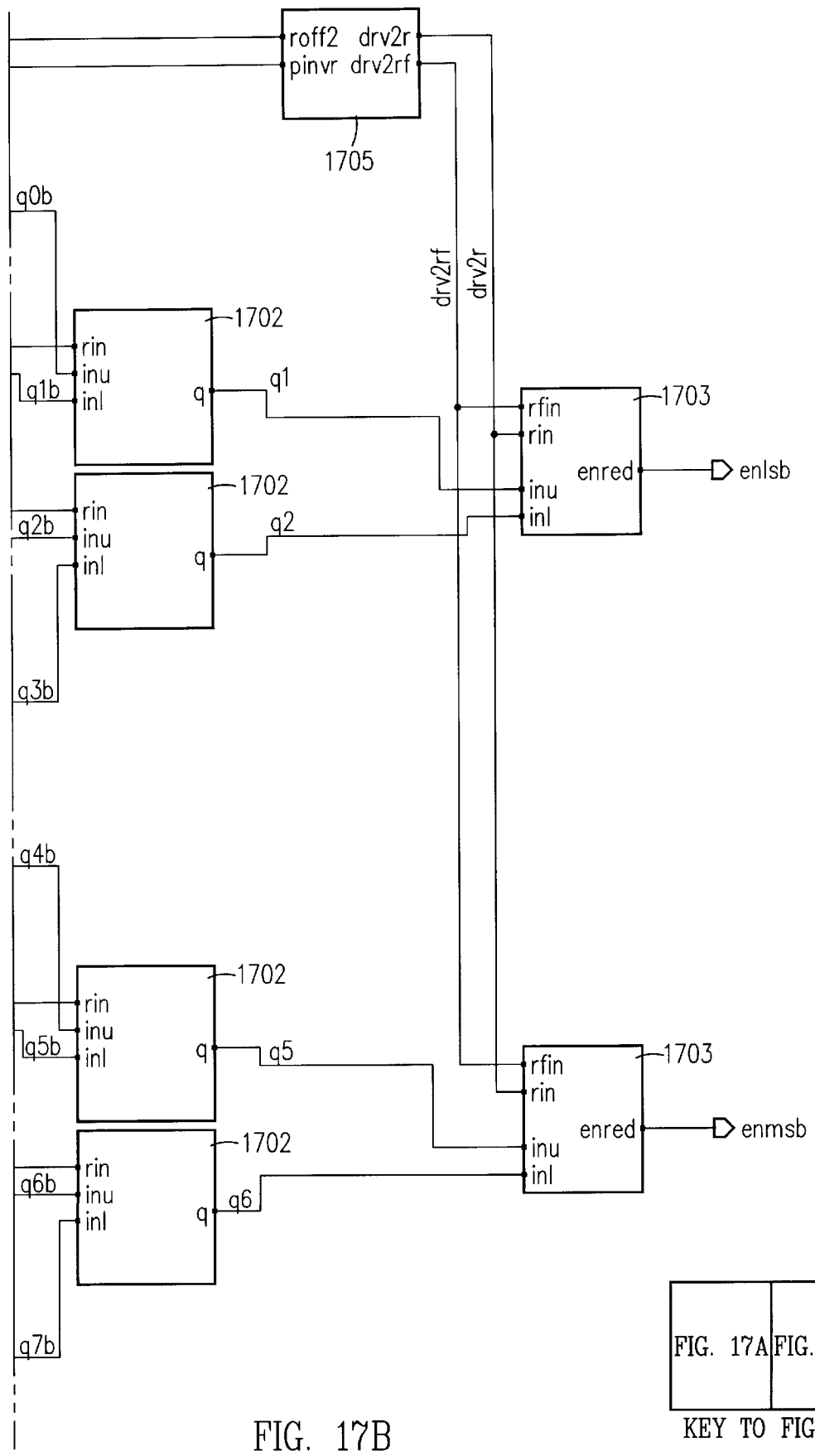
FIG. 17B
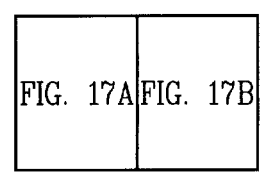
KEY TO FIG. 17

DUAL COMPARATOR CIRCUIT AND METHOD FOR SELECTING BETWEEN NORMAL AND REDUNDANT DECODE LOGIC IN A SEMICONDUCTOR MEMORY DEVICE

CROSS-REFERENCE TO RELATED APPLICATION

This application claims the benefit under 35 U.S.C. §119 (e) of U.S. Provisional Application Ser. No. 60/027,329, filed Sep. 30, 1996, entitled "An X86 Microprocessor with Multi-Media Extensions," which describes an exemplary microprocessor embodiment of the present invention and which is incorporated herein by reference in its entirety.

BACKGROUND OF THE INVENTION

1. Field of the Invention

The present invention relates to redundancy circuits and methods for replacement of failed memory cells in a semiconductor memory device.

2. Description of the Related Art

Semiconductor memory devices are generally organized in a two-dimensional array, wherein the memory elements are located at the intersection of rows, or "word lines," and columns, or "bit lines," of the matrix. To access a given memory element, it is necessary to select the word line and the bit line at the intersection of which the memory element is located. For this purpose, memory addresses are divided into row and column address signals, which are decoded independently.

In the manufacture of semiconductor memories, defects are frequently encountered that affect a limited number of memory elements in the memory array. In order to prevent rejection of an entire chip due to the presence of a comparatively small number of defective memory elements, and thereby increase manufacturing process yield, the typical manufacturing technique provides for a certain number of redundant memory elements.

Redundant memory elements have been used as replacements for those elements that, during testing of the memory device, prove defective. Redundancy circuitry typically includes laser programmable fuses or other non-volatile memory elements suitable to store those address configurations corresponding to the defective memory elements. Laser programmable fuses have several disadvantages including requiring significant testing and laser programming manufacturing infrastructure. Furthermore, laser programmable fuses are large compared to feature sizes achievable with typical modern process techniques and, as a result, create layout problems when required on pitch. Laser programmable fuses must be programmed prior to packaging and therefore cannot be used to replace defects that develop during burn-in, or subsequent in-use conditions.

For at least some of these reasons, other non-volatile memory elements such as electrically programmable fuses or floating-gate MOSFETs have been used to store address configurations corresponding to defective memory elements. For example, U.S. Pat. No. 5,313,424 to Adams et al., entitled "Module Level Electronic Redundancy" and issued May 17, 1994, discloses an array built-in self-test (ABIST) system in which electrically programmable fuses can be programmed after packaging to encode faulty cell addresses.

Another redundancy method is disclosed in U.S. Pat. No. 5,659,509 to Golla and MacCarrone, entitled "Method for Programming Redundancy Registers in a Row Redundancy Integrated Circuitry for a Semiconductor Memory Device, and Row Redundancy Integrated Circuitry" issued Aug. 19, 1997, in which redundant word lines are associated with respective row redundancy registers for storage of the address of a defective word line. Whenever the defective word line is addressed, the corresponding redundant word line is selected. Each row redundancy register comprises programmable non-volatile memory elements, such as fuses or a floating gate MOSFET, a load circuit for reading the information stored therein, and a program load circuit for the programming of the memory element according to the logic state of a respective address bit from the row address. In the redundancy design disclosed in the '509 patent, activation of a redundant word line selection signal itself prevents the corresponding defective word line from being selected. Thus, both selection of the redundant word line and deselection of the corresponding defective normal word line are provided by output of a single comparator comparing word line address with a defective word line address.

Although no particular comparator circuitry is disclosed in the '509 patent, the single comparator is necessarily static because typically the only way to generate temporally consistent normal and redundant row word line behavior under TRUE=(redundant row enable, normal row disable) and FALSE=(redundant row disable, and redundant row enable) conditions is with inverted and non-inverted versions of the single comparator output. Also, since the comparator is static and exhibits longer delay, the predecoder (or decoder) that is selected or de-selected, intermediately driven wordlines can be generated. Setup and hold time of a single static comparator-based, redundant word line selection/normal word line deselection signal implementation can adversely impact access time of a dynamic wordline driver semiconductor memory device.

SUMMARY OF THE INVENTION

Accordingly, an embodiment of the present invention provides a semiconductor memory array with a redundancy circuit having dual comparators. A dynamic logic NOT comparator compares a defective row address signal to the row address signal supplied to the array and supplies an enable signal to normal row predecode circuitry in response to a mismatch in at least one bit position. A TRUE comparator configured in parallel with the NOT comparator compares a defective row address signal to the row address signal supplied to the array and supplies an enable signal to redundant row (pre-)decode circuitry in response to a match in all bit positions. Thus either the normal row predecode circuitry or the redundant row redecode circuitry is enabled, but not both. Advantageousely, enabling of normal row predecode circuitry does not depend on operation of the TRUE comparator.

By providing a normal row pre-decode enable signal in dynamic NOT comparator logic, rather than by generating a normal decoder deselection signal from a single, necessarily static, redundant row address comparator, embodiments of the present invention eliminate redundant row address comparator-related setup and hold time constraints on timing of the semiconductor memory array. Timing challenges presented by redundant row (pre-)decode are less severe and accordingly, the TRUE comparator configured in parallel with the NOT comparator to supply a disable signal to redundant row (pre-)decode circuitry may be static or dynamic logic. Furthermore, a static NOT comparator could also be used if the static NOT comparator meets access time design goals. Because of its generally superior speed, dynamic logic is preferred for the NOT comparator. In at least one embodiment, the TRUE comparator is likewise implemented in dynamic logic.

Some embodiments of the present invention advantageously provide a redundancy circuit which avoids laser programmable fuses, particularly, on pitch fuses and reduces manufacturing equipment and process step costs otherwise associated therewith. For example, some embodiments are provided with built-in self-test circuits programmably coupled to volatile redundancy registers, wherein the dynamic NOT comparator logic and the TRUE comparator respectively supply a normal row pre-decode enable signal and a redundant row (pre-)decode disable signal each based on failed row addresses stored in volatile redundancy registers at, or coincident with, power up or reset.

In one embodiment in accordance with the present invention, a semiconductor memory having a matrix of memory elements including normal memory elements and redundant memory elements includes a row predecode circuit including an enable node and redundant row selection circuitry. The redundant row selection circuitry includes a dynamic logic circuit implementing an N-bit wide NOT comparator coupled into a row address path of the semiconductor memory and coupled to supply the enable node with an enable signal if at least one of N row address bits mismatch a corresponding bit of a failed row address. In addition, the redundant row selection circuitry includes a logic circuit implementing an N-bit wide TRUE comparator coupled into the row address path to supply a decode signal selective for a redundant row if all of the N row address bits match corresponding bits of the failed row address.

In another embodiment in accordance with the present invention, a method for providing redundancy in a semiconductor memory integrated circuit having normal rows and at least one redundant row includes the following. In response to a row address presented to the semiconductor memory, simultaneously performing in dynamic logic, TRUE and NOT comparisons of the presented row address with a failed row address; (a) enabling, in response to an affirmative NOT comparison, predecode logic associated with the normal rows; and (b) enabling, in response to an affirmative TRUE comparison, predecode logic associated with the at least one redundant row. The NOT comparison is performed independently of the TRUE comparison such that timing of the (a) enabling is substantially unaffected by the TRUE comparison.

In yet another embodiment in accordance with the present invention, an apparatus includes a semiconductor memory array, row predecoder means, redundant row selection means, NOT comparator means, and TRUE comparator means. The row predecoder means is coupled to at least partially decode a row address into the semiconductor memory array and includes a first enable terminal. The redundant row selection means includes a second enable terminal. The NOT comparator means is coupled into a row address path of the semiconductor memory and coupled to supply the first enable terminal with an enable signal if the row address mismatches a failed row address encoding. The TRUE comparator means is distinct from the NOT comparator means and is coupled into the row address path to supply, via the redundant row selection means, a decode signal selective for a redundant row if the row address matches the failed row encoding.

In still yet another embodiment in accordance with the present invention, an integrated circuit chip includes an array of semiconductor memory elements including normal and redundant memory elements, a rewritable on-chip encoding to encode a failed address corresponding to a redundant group of the redundant memory elements, a TRUE comparator circuit, and a dynamic NOT comparator circuit. The TRUE comparator circuit is coupled to select the redundant group when an address supplied to the array corresponds to the failed address, whereas the dynamic NOT comparator circuit is coupled to enable address decode circuits when the address does not correspond to the failed address. In various further embodiments, the redundant group is a redundant row, a redundant word line, or a redundant column of the redundant memory elements. In still other further embodiments, the integrated circuit chip is a memory chip or a processor chip or including circuits of the processor, of the memory, or of both.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
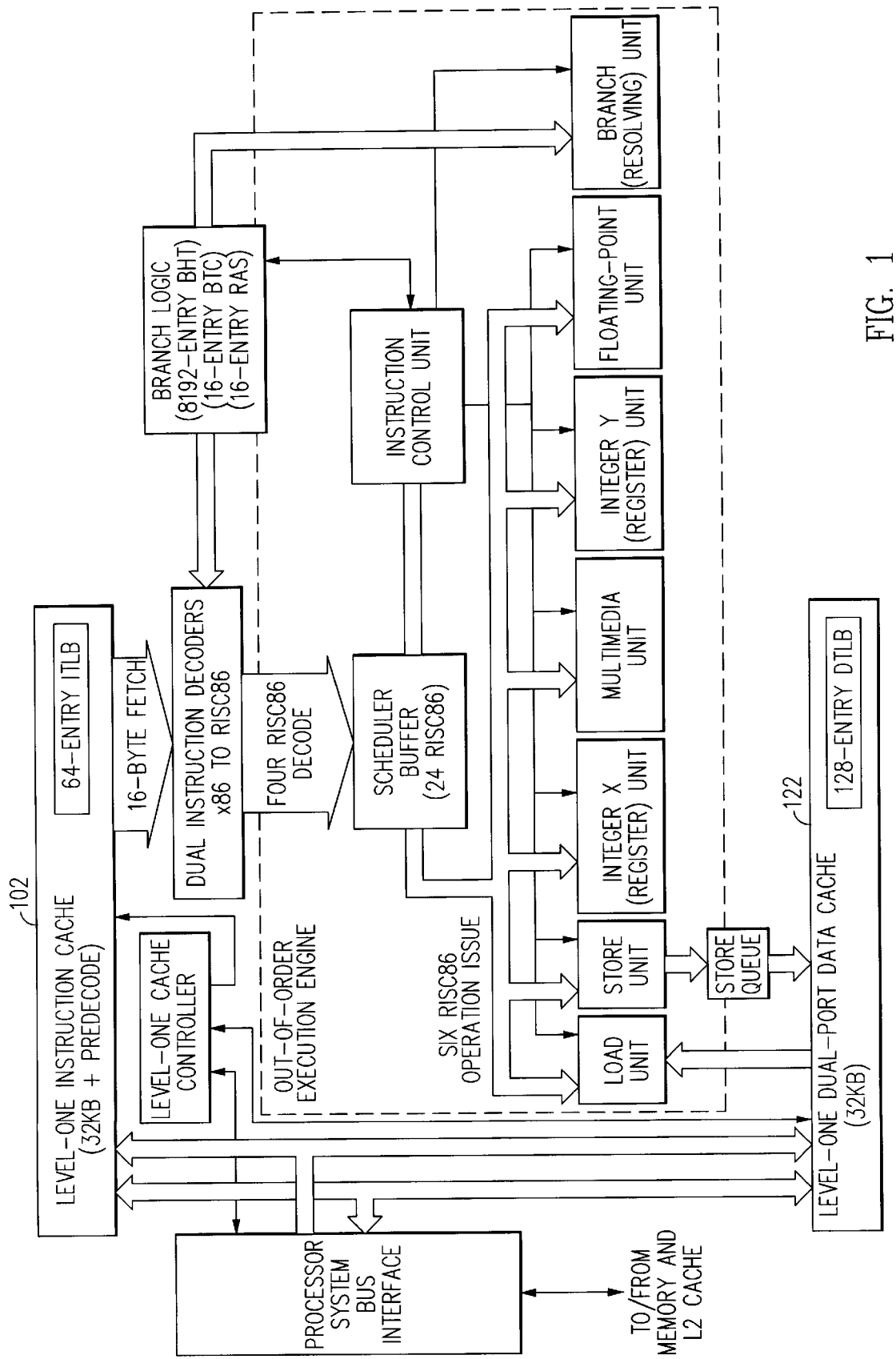
FIG. 1 is a block diagram illustrating an integrated circuit microprocessor architecture including memory arrays having redundancy circuits in accordance with an embodiment of the present invention.
Figure 2:
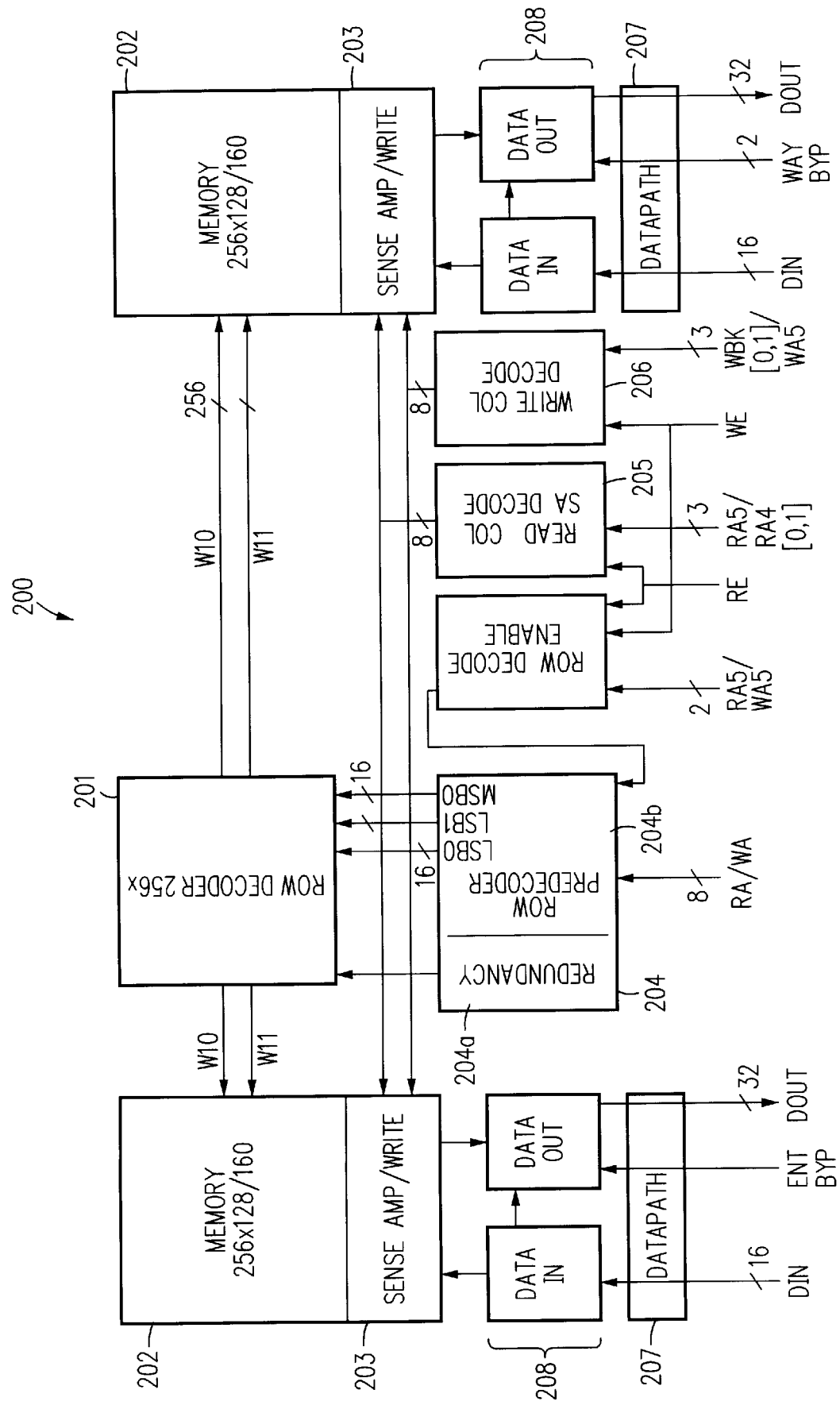
FIG. 2 is a block diagram of an 8 KB memory block having redundancy circuits in accordance with an embodiment of the present invention and which is exemplary of component blocks of cache memory arrays of the integrated circuit microprocessor of FIG. 1.

FIG. 2 depicts data and addressing paths in an exemplary 8K Byte block of memory incorporating redundant row circuitry in accordance with an embodiment of the present invention. FIG. 1 is an architectural block diagram of a microprocessor 100 having cache memory arrays (e.g., instruction cache 102 and data cache 122) built from component 8K Byte blocks as shown in FIG. 2. A 20K Byte predecode cache based on an analogous 10K Byte block is also included in microprocessor 100. Although redundant row circuitry in accordance with the present invention is well suited for use in caches or other memory arrays of a processor such as microprocessor 100, the invention is not limited to such embodiments and, to the contrary, is more generally applicable to integrated circuits having redundant memory structures. Microprocessor 100 is described in greater detail below.

Focusing illustratively on the 8K Byte block of FIG. 2, memory block 200 includes two subarrays of memory elements organized as 256 rows by 128 columns. Each subarray includes both normal rows and two additional redundant rows of memory elements. In order to reduce power dissipation, dual word lines per row (illustratively w10 and w11) are used with a one-of-two block select for both normal and redundant rows. Either or both of these word lines can be activated dependent on wrap-around between upper and lower cache line words. Redundant row predecode 204a and normal row predecode 204b expansion circuitry supply main row decoder circuitry 201 which in turn drives selected word line(s).

Main row decoder circuitry 201, column write decode circuitry 206, sense amplifier decode circuitry 205 and data path circuits 207 use dynamic logic with keepers for delay improvement. The dynamic circuits are static held by weak keepers. Data inputs, bypass and storage buffer circuitry 208 are conventional CMOS logic. Redundant row predecode expansion circuitry 204a and normal row predecode expansion circuitry 204b are implemented in dual rail dynamic non-clocked logic.

A one per column pitch regenerative sense amplifier architecture allows for late selection by the column decode and way select after cache sensing is toleranced for offsets. Sense amplifier selects are decoded and the outputs wire-OR'ed for column selection. Way select and bypass select follow in a 2 level cascade of 2 input muxes. The wire-OR, as well as, the 2 input muxes and the output driver are dynamic logic for delay improvement. The drivers gaining up to the wide set (64x) of 2 input way select muxes are also dynamic logic.

Figure 3:
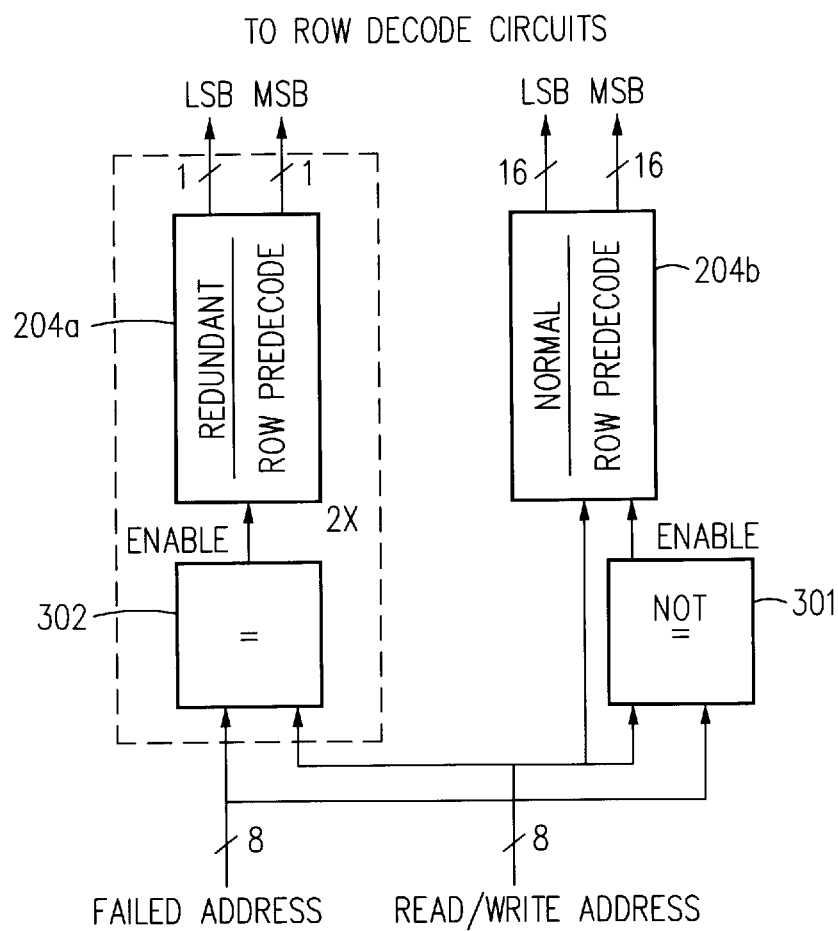
FIG. 3 is a block diagram depicting TRUE and NOT comparator circuits coupled to supply redundant and normal row predecode circuits with enable signals in accordance with an embodiment of the present invention.

An illustrative embodiment of dual, parallel and complementary comparators for selectively enabling predecode circuits (such as redundant row predecode circuit 204a and a normal row predecode circuit 204b) is shown in FIG. 3. The embodiment of FIG. 3 abstracts away support for the dual word line rows described above and focuses on support for a single redundant row. Dual comparators supply a redundant row predecode circuit 204a and a normal row predecode circuit 204b with respective enable signals. In particular, a dynamic logic NOT comparator circuit 301 compares a read or write address with a failed row address and supplies an enable signal to normal row predecode circuit 204b if the two addresses do not coincide. Similarly, TRUE comparator circuit 302 compares a read or write address with the failed row address and supplies an enable signal to redundant row predecode circuit 204a if the two addresses do coincide.

By configuring NOT comparator circuit 301 and TRUE comparator circuit 302 in parallel to enable a respective one or the other of the redundant row predecode circuit 204a and a normal row predecode circuit 204b, the redundancy logic configuration of FIG. 3 eliminates comparator-related setup and hold time constraints on timing of row addressing paths (including e.g., predecode and decode circuits) of a semiconductor memory array or subarray such as memory block 200. Only NOT comparator circuit 301 (and not TRUE comparator circuit 302) is on the signal path to enable normal row predecode circuit 204b.

Unlike a single static comparator design in which an enable signal (e.g., enable redundant row) and its complement respectively enable and disable redundant and normal row logic, the dual comparator design of FIG. 3 does not need to account for setup and hold time otherwise necessary to ensure that an enable redundant row signal and a disable normal row signal are consistent. Furthermore, particular dynamic logic implementations of NOT comparator circuit 301 can rapidly supply a normal row enable signal in response to a single bit mismatch between the read/write row address and the failed row address.

Figure 23B:
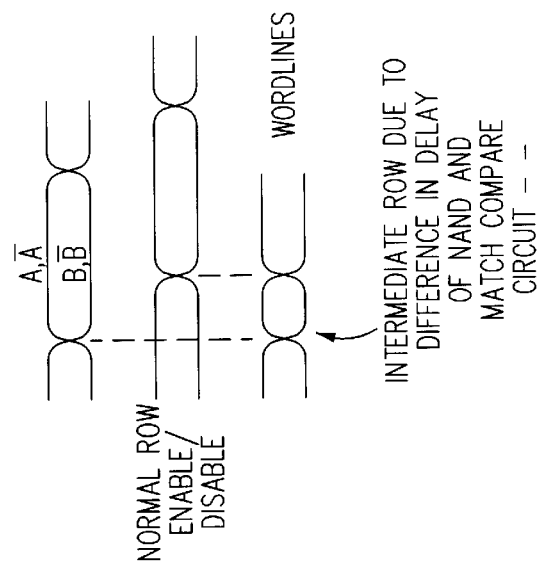
FIG. 23A is a circuit diagram and FIG. 23B is a corresponding timing diagram which together illustrate some limitations of a single static comparator based design with asynchronous inputs.
Figure 23A:
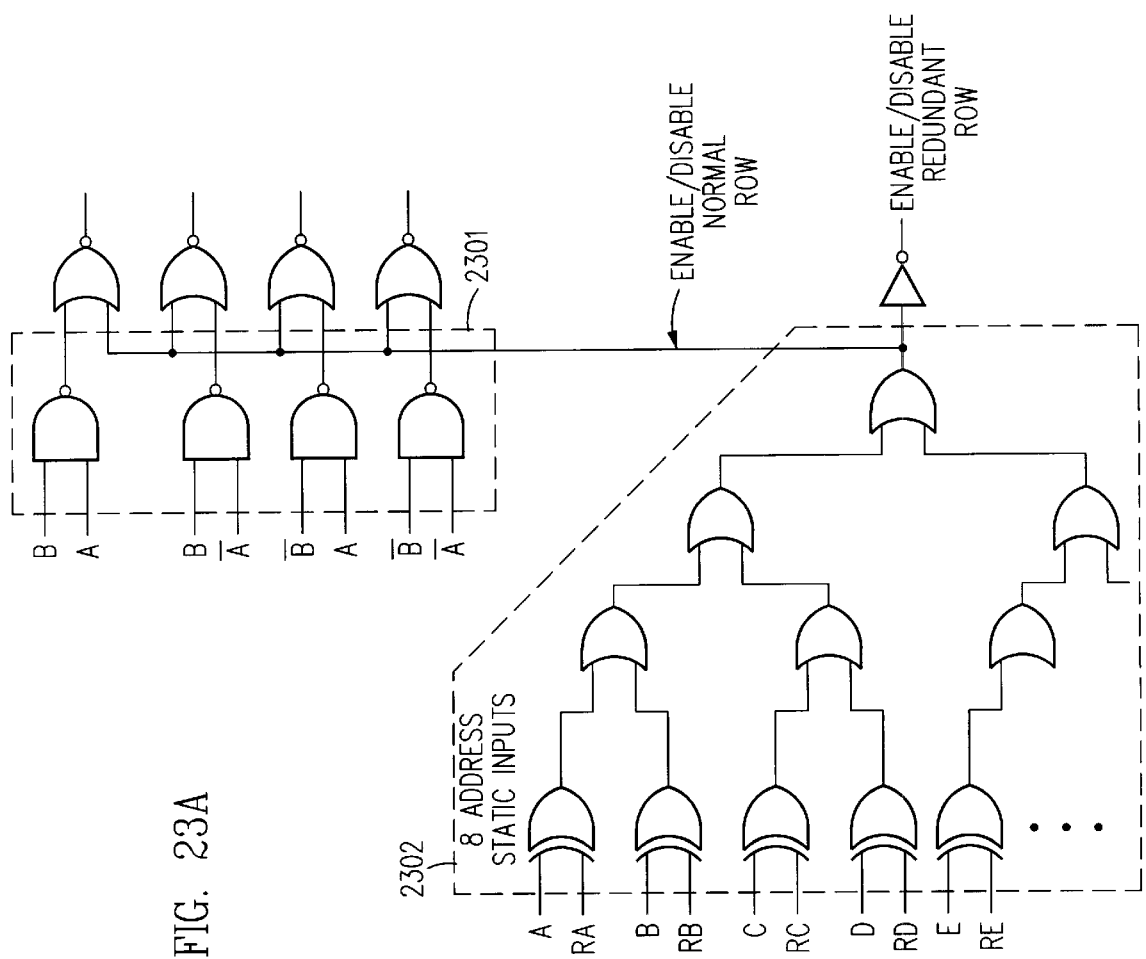

Limitations of a single static comparator design are now illustrated with reference to FIGS. 23A and 23B, which depicts an illustrative CMOS static predecoder design and timing thereof. Static logic addresses A, B and $\overline{A}$, $\overline{B}$ retain last state, as opposed to a dynamic logic implementation, which precharges after each valid address. In contrast, a dynamic logic implementation typically precharges internal nodes to a known state and selects the null condition. As illustrated in FIG. 23B, intermediate row selections can occur due to differences in delay through NAND circuit 2301 and match compare circuit 2302. As a result, a bitlines coupled to a row selection circuit may begin to discharge in response to the intermediate row selection. Although the illustration of FIG. 23B focuses on a row address transition preceeding an enable/disable transition, an intermediate row selection may also occur if the enable/disable transition preceeds the row address transition. Precisely timing the two signals under varying process and operating conditions can be very difficult. A clocking input register or address transition detection (ATD) could be used to overcome some of these problems; however, each imposes a speed penalty and, it the case of ATD, noise sensitivity is increased.

Figure 4:
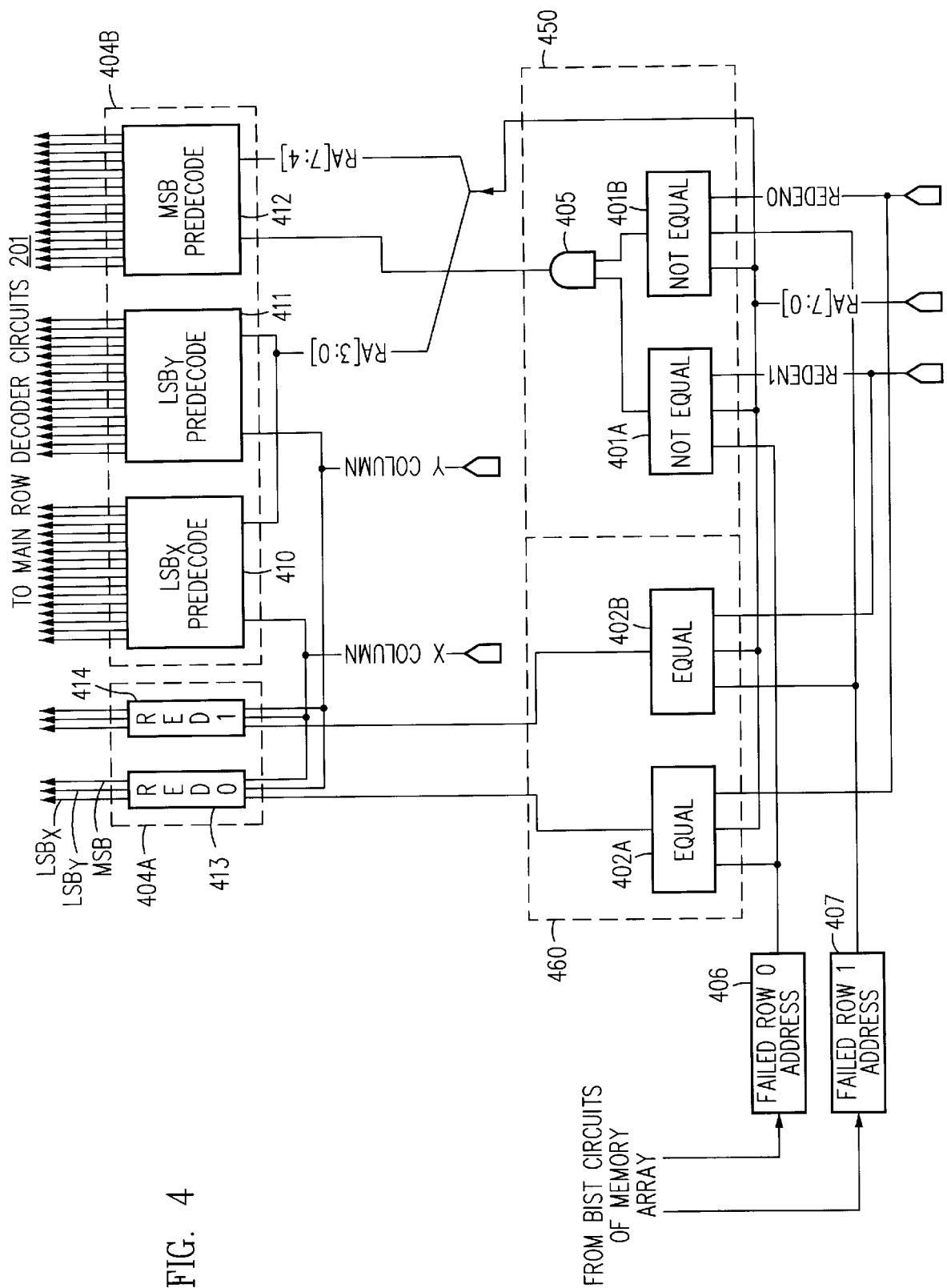
FIG. 4 is a block diagram depicting, in the context of a memory block such as that of FIG. 2, redundant row address TRUE and NOT comparator circuits coupled to supply redundant and normal row predecode circuits with respective enable signals based on contents of failed row address storage and in accordance with an embodiment of the present invention.

In contrast, a dual comparator redundancy circuit in accordance with the present invention normal row enable/disable and redundant row disable/enable signals to be independently supplied without the setup, hold time, and intermediate row selection problems of a single static comparator. FIG. 4 depicts dual comparator redundancy logic supporting two redundant rows in the split word line architecture described above. Failed row address stores (e.g., failed row 0 address register 406 and failed row 1 address register 407) store addresses of up to two failed rows of memory array 202. Redundancy NOT comparators 401A and 401B compare respective failed row addresses, if any, with a read or write row address (RA[7:0]) presented to memory array 202. On a mismatch by both of the NOT comparators, the output of AND logic circuit 405 enables normal row predecoder 404B. In the embodiment of FIG. 4, normal row predecoder 404B includes least significant bit (410 and 411) and most significant bit (412) portions to supply 16-bit predecode indications to main NAND decoders of FIG. 5. X-column and Y-column portions (i.e., $LSB_X$ predecoder portion 410 and $LSB_Y$ predecoder portion 411) decode the lower order bits (RA[3:0]) of the row address presented to memory array 202 and are enabled by respective X-column and Y-column enable signals. In the particular embodiment of FIG. 4, only the most significant bit portion of normal row predecoder 404B is enabled (or not enabled) by outputs of NOT comparators 401A and 401B, although a variety of different enablings of normal row predecoder 404B are possible. Combinations of a most significant predecode bit and a least significant predecode bit are selective for particular NAND row decoder circuits of FIG. 5. In one embodiment, most significant bits are faster than least significant bits due to a configuration of final row decoder NAND circuits, in which common node line 520 increases the strength of intermediate node pull down drive to an intermediate node.

Redundancy TRUE comparators 402A and 402B also compare respective failed row addresses, if any, with a read or write row address (RA[7:0]) presented to memory array 202. On a match, the matching TRUE comparator enables a corresponding redundancy predecode circuit (e.g., redundancy predecode circuit 413 or redundancy predecode circuit 413) of redundant row predecoder 404A. Like the normal row predecoder 404B, redundant row predecoder 404A supplies a most significant predecode bit and one of two column-selected least significant predecode bits to main row decoder NAND circuits of FIG. 5. In one embodiment, failed address stores are volatile registers initialized by built-in self-test (BIST) circuits such are those described in co-pending U.S. patent application Ser. No. 08/938062 entitled, "Register-Based Redundancy Circuit and Method for Built-In Self-Repair of a Semiconductor Memory Device," naming, Imtiaz P. Shaik, Dennis L. Wendell, Benjamin S. Wong, John C. Holst, Donald A. Draper, Amos Ben-Meir and John G. Favor as inventors and filed on even date herewith, which application is hereby incorporated herein by reference in its entirety.

Figure 5:
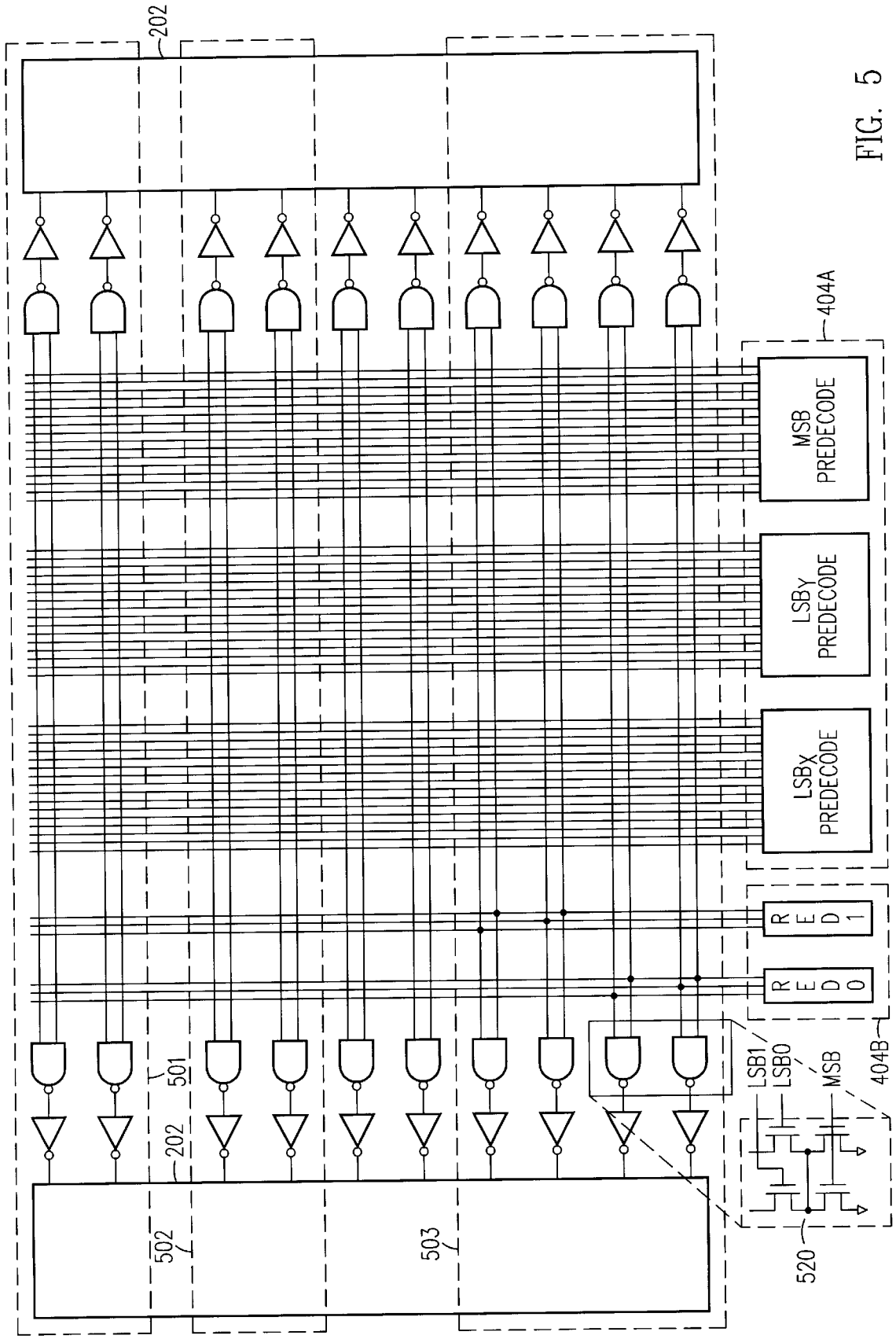
FIG. 5 is a block diagram depicting row predecode logic of FIG. 4 together with word lines, redundant word lines, main row decode logic and word line driver logic in accordance with an embodiment of the present invention.

FIG. 5 depicts a conventional main decoder stage coupled to the outputs of normal row predecoder 404B and redundant row predecoder 404A. Redundant row predecoder outputs are selective for particular row- and word-lines of redundant rows 503 of memory array 202. Similarly, normal row predecoder outputs are selective for other particular row- and word-lines of memory array 202 (illustratively, normal row 502 or 501).

Figure 6:
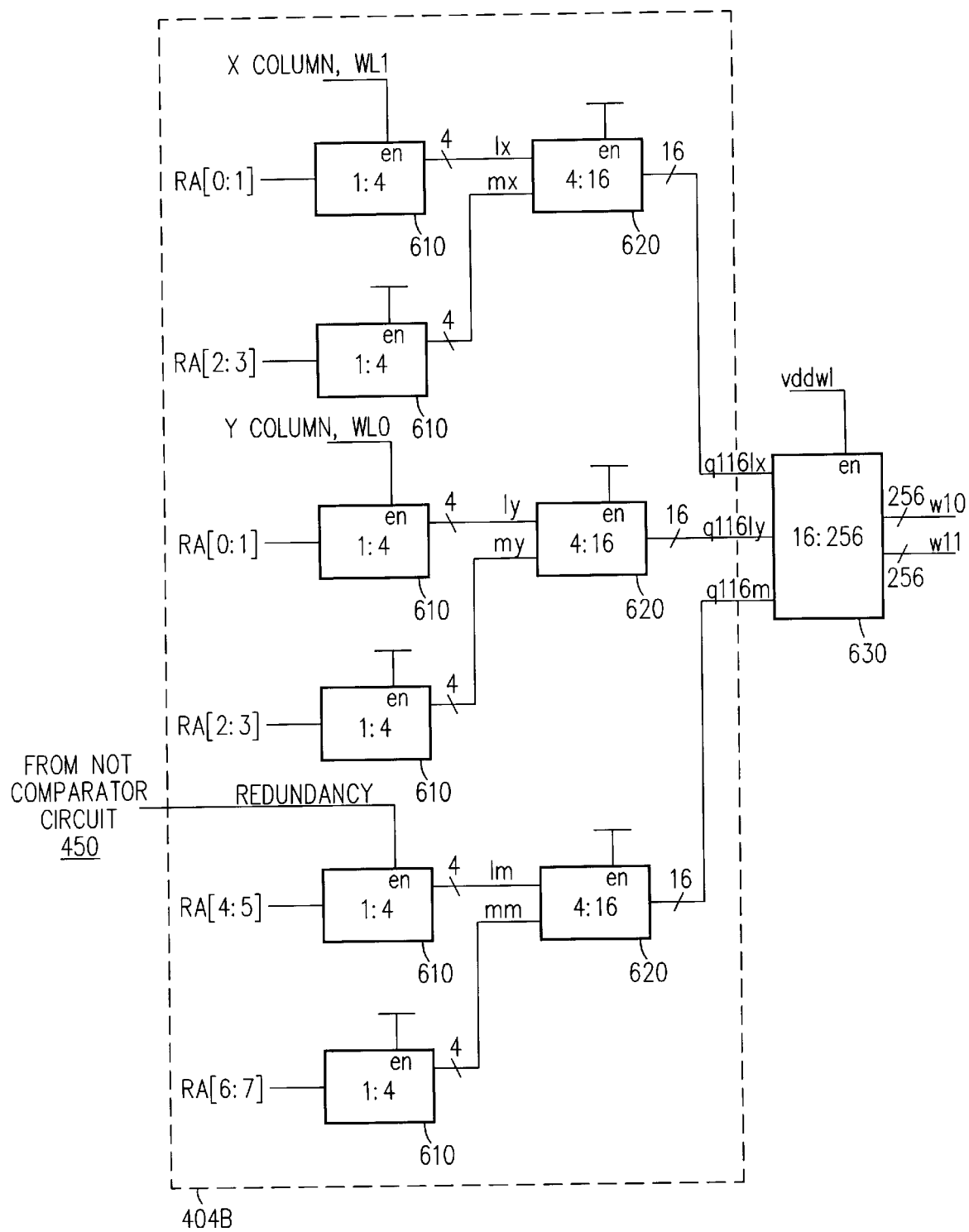
FIG. 6 block diagram depicting NOT comparator circuit enabling of normal row predecoder in accordance with an embodiment of the present invention.

Referring back to FIG. 4, redundant row predecoder 404A (1:1) is implemented in a single stage of dynamic logic whereas normal row predecoder 404B (1:256) is implemented in multiple stages of dynamic logic as shown in the tree structure of FIG. 6. First stage (1:4) and second stage (4:16) decoder circuits 610 and 620 are coupled to supply main row decoder circuit 630 with most and least significant bits. The single stage (1:1) of redundant row predecoder 404A and multiple stages (1:4 and 4:16) of normal row predecoder 404B each include a dynamic gate, modified delayed reset circuit configuration, such as that shown in FIG. 7A, with timing behavior such as that shown in FIG. 7B.

Figure 7A:
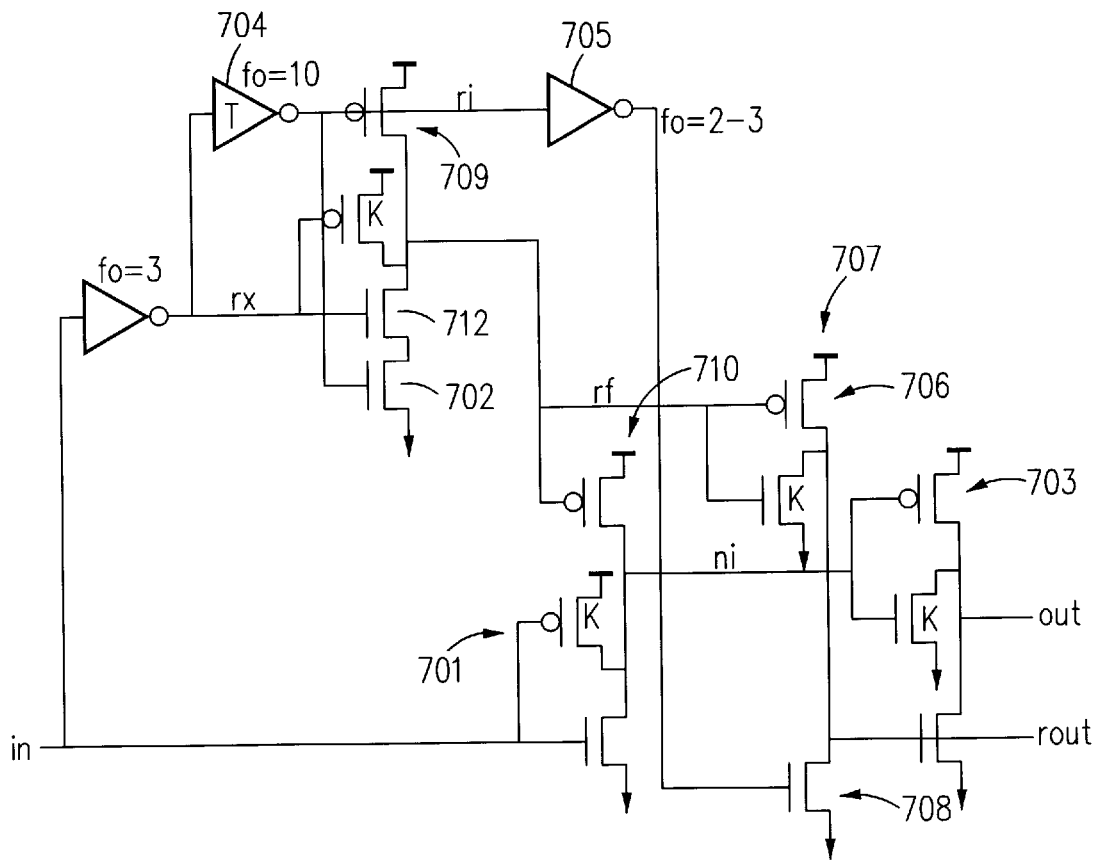
FIGS. 7A depicts an exemplary modified delayed reset circuit configuration corresponding to circuits of normal row predecoder logic in accordance with an embodiment of the present invention.
Figure 7B:
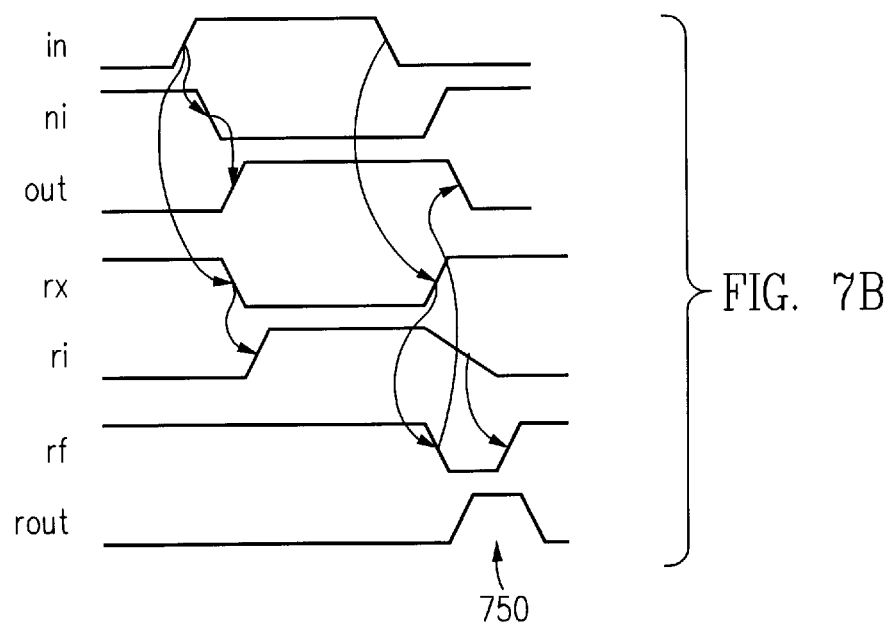
FIG. 7B depicts timing behavior of the exemplary modified delayed reset circuit of FIG. 7A in accordance with an embodiment of the present invention.

Referring now to FIGS. 7A and 7B, timing behavior of predecoder circuits is described. Those of skill in the art will appreciate the behavior of multiple input decoder circuits (e.g., first stage (1:4) and second stage (4:16) predecoder circuits 610 and 620) from the illustrative single input circuit of FIG. 7A. In response to line in going high, inverter 701 pulls line ni low. In addition, lines rx and ri go low and high respectively, decoupling line rf (now precharged) from precharge FET 709. Line ni supplies inverter 703, pulling line out high. Line in subsequently goes low and line rx goes high in response thereto, triggering the discharge through n-channel FET 702 during the period when line ri has not yet fallen to low. This discharge brings line rf low, thereby pulling line rout high through inverter 706. In response to the eventual fall of line ri to low, n-channel FET 709 pulls line rf high. Inverter 706 supplies and output pulse on line rout. The exemplary circuit of FIG. 7A includes n-channel and p-channel FET pairs defining inverters which can also be viewed as dynamic stage pulldowns with keepers K to maintain static state. A third transistor associated with each dynamic stage pulldown is a recovery transistor which drives at typically 10× the current of the corresponding keeper K.

Operation of the recovery and pulldown transistors and sizings thereof are now described in the context of FIG. 7A. Those of skill in the art will appreciate variations for a particular process and design rules employed. In the circuit of FIG. 7, if n-channel FET pulldown 712 is of channel width W to drive load, then the p-channel FET recovery transistor 709 is of channel width ≈2W to give equal rise and fall on node ni. The keeper transistor K associated with pulldown 712 is sized W/5→W/10 to just make node ni staic and have some noise immunity on the input, i.e., the trip point is not sub $V_T$ of the n-channel FET. Speed improvement is due to elimination of overlap current due to the p-channel FET being on as the n-channel FET is switching on. Fanout can be increased since the p-channel recovery can be driven later in time and therefore have fanup stages not in the forward delay path.

Capacitance looking forward is W+W/10 versus 3W in a standard CMOS inverter with p-channel device of 2W and n-channel device of W.

Regarding fanouts, fanout of inverter 704 is high (e.g., 10 as compared to a normal fanout of ≈3 to recover line rf quickly). The high fanout allows sufficient time to propagate rf. This, in turn, generates the negative ramp on ri (see FIG. 7B) so that rf is propagated and has a wide enough pulse until the trip point of recovery and enable inverter (transistors 709 and 702) is reached. In this way, inverter 705 should not transition until rf goes high, turning off pullup transistor 706.

Figure 8:
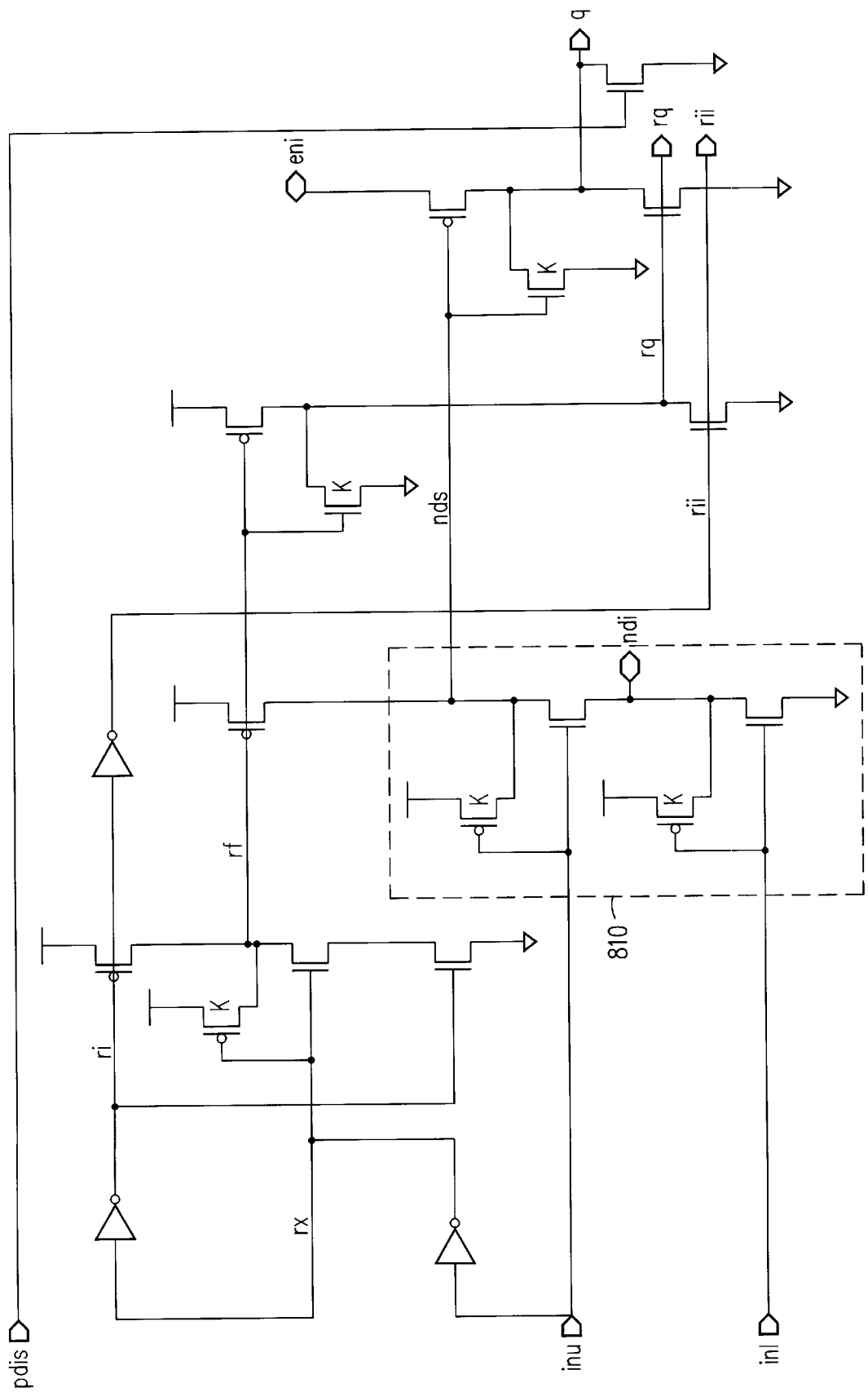
FIG. 8 depicts a modified delayed reset predecode circuit of a first stage of normal row predecoder logic in accordance with an embodiment of the present invention.
Figure 11:
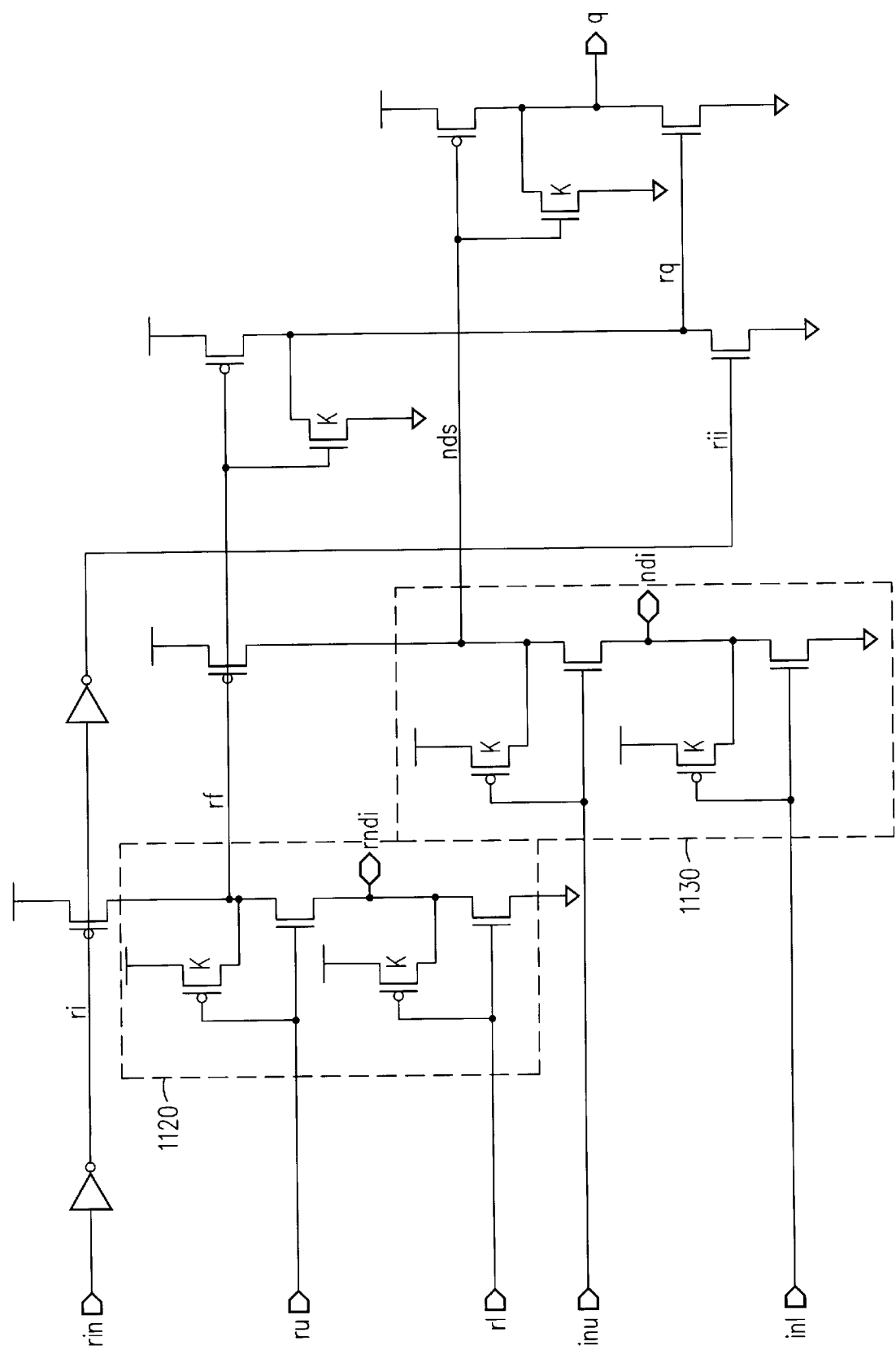
FIG. 11 depicts a modified delayed reset predecode circuit of a second stage of normal row predecoder logic in accordance with an embodiment of the present invention.

Circuit diagrams for components of predecoder circuits 610 and 620 based on the modified delayed reset of FIG. 7A are shown in FIGS. 8 and 11, respectively. In particular, predecoder circuits 610 (FIG. 6) include 4-wide instances of the modified delayed reset circuit of FIG. 8. Respective instances of lines inu and inl are coupled to respective true and complement pairings of row address bits (e.g., true and complement pairings RA[6:7] or RA[4,5], or RA[2:3], etc.). Circuit 800 of FIG. 8 is similar to that of FIG. 7A but with a NAND circuit (rather than an inverter) coupled to drive line nds which corresponds to line ni of FIG. 7A. Terminals ndi of first and second and of third and fourth instances of circuit 800 coupled together respective instances of NAND circuit 810. Because of the common intermediate node 520 described above, it is desirable to use all the n-channel pulldown drive from respective n-channel pulldown transistors. Enable terminals eni are coupled to the respective enable sources shown in FIGS. 4 and 6. In particular, terminals eni of circuits 800 corresponding to the RA[4:5] instance of predecoder circuit 610 are coupled to redundancy enable line (i.e., the output of AND gate 405, FIG. 4). Outputs lines q and rq, as well as reset path lines rii, are propagated to the next stage of predecoder circuits 620.

Figure 9:
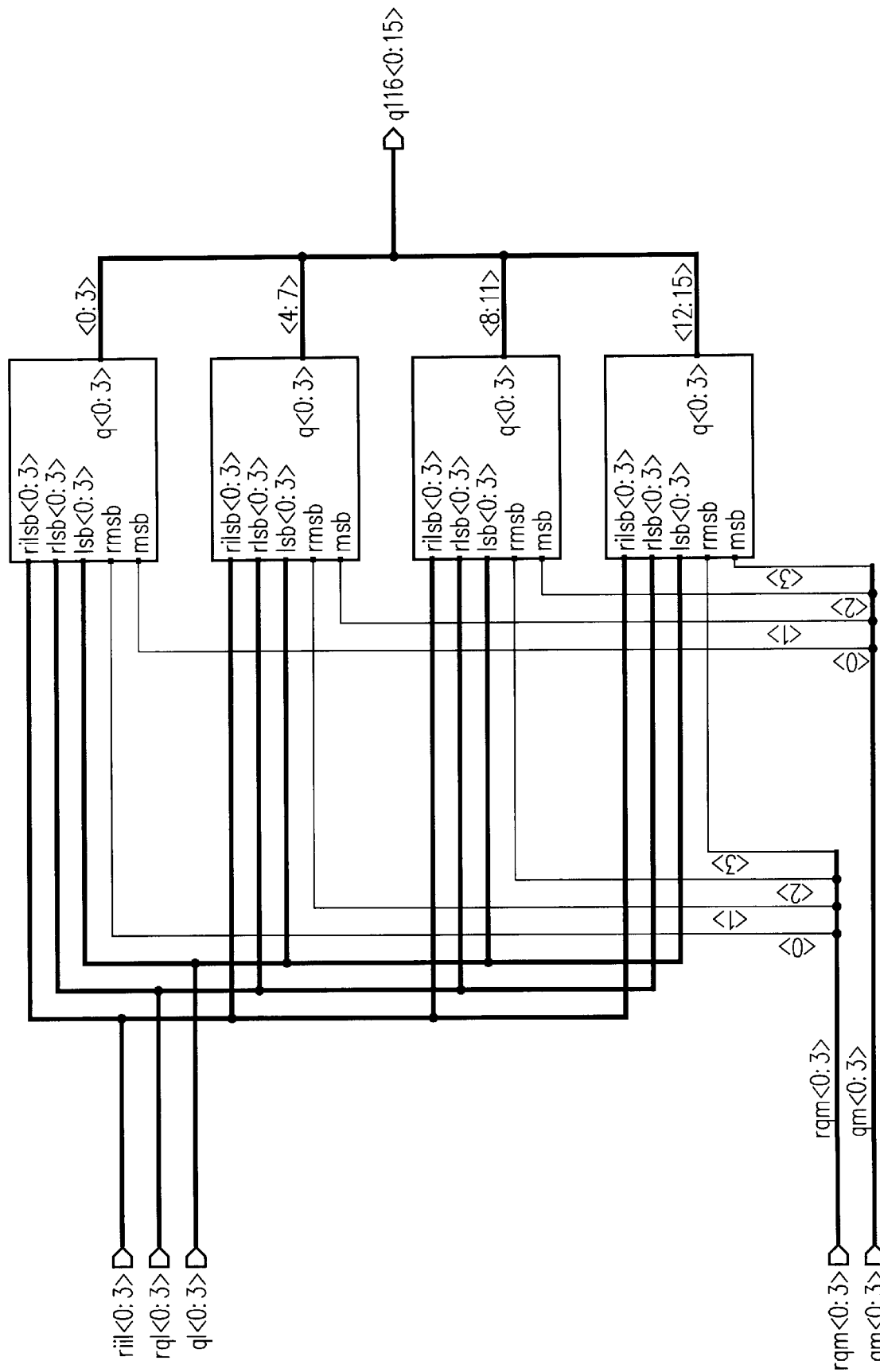
FIGS. 9 and 10 hierarchically depict an organization, within normal row predecoder logic, of multiple instances of the modified delayed reset predecode circuit of FIG. 8 in accordance with an embodiment of the present invention.
Figure 10:
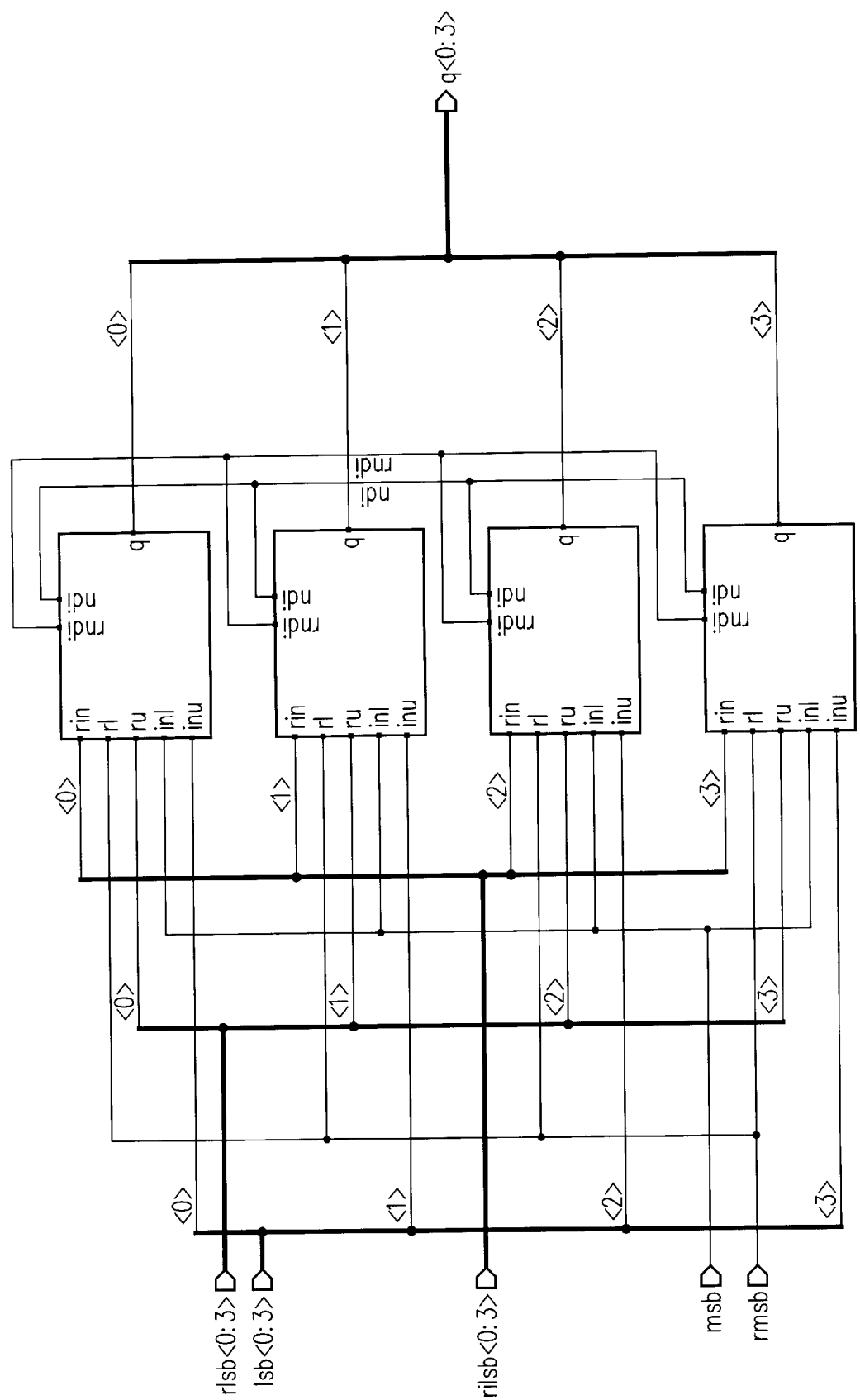

Referring now to FIG. 9, 10, and 11, predecoder circuits 620 include 16-wide instances of the modified delayed reset circuit of FIG. 11. Instances of the modified delayed reset circuit of FIG. 11 are organized hierarchically as shown in FIGS. 9 and 10. Respective instances of lines ru and inu are coupled to respective pairings of outputs from the preceding lower order row address bits stage circuits (i.e., row predecoder circuits 610), whereas respective instances of lines rl and inl are coupled to respective pairings of outputs from the preceding higher order row address bits stage circuits (i.e., row predecoder circuits 610). Instances of line rin are coupled to receive reset path signals from respective preceding lower order ones of the row predecoder circuits 610. Circuit 1100 of FIG. 11 is similar to that of FIG. 7A but with NAND circuits 1130 and 1120 coupled input and reset signal paths which correspond to line ni and line rf of FIG. 7A. Terminals rndi and ndi of adjacent groups of four circuit 1100 instances are coupled together. As described above, this configuration exploits all the n-channel pulldown drive.

Figure 12A:
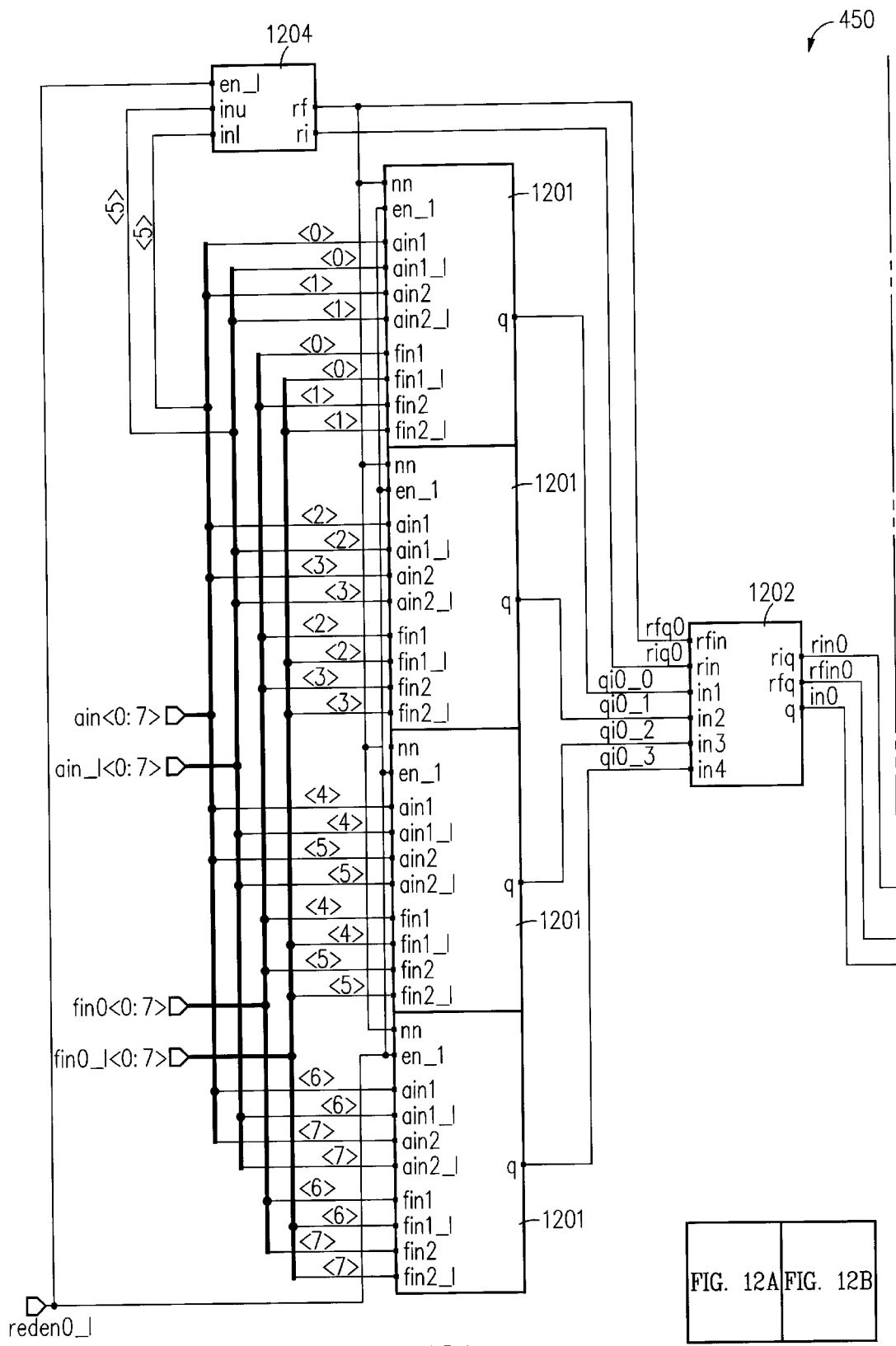
FIG. 12 depicts an organization of a dynamic NOT comparator, in accordance with an embodiment of the present invention, for supplying normal row predecode circuits with an enable signal when an addressed row does not match a failed row address.
Figure 12B:
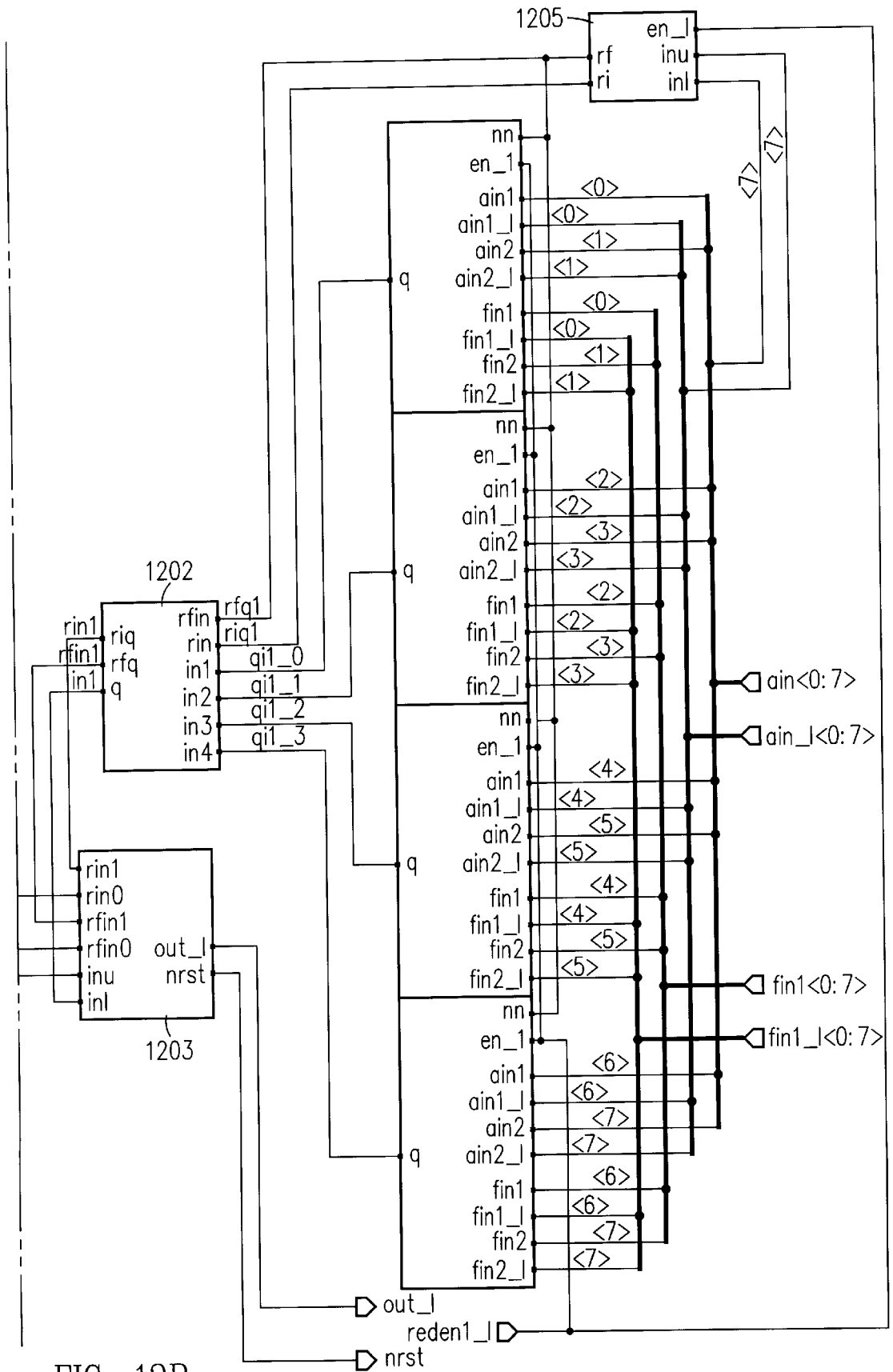
Figure 13:
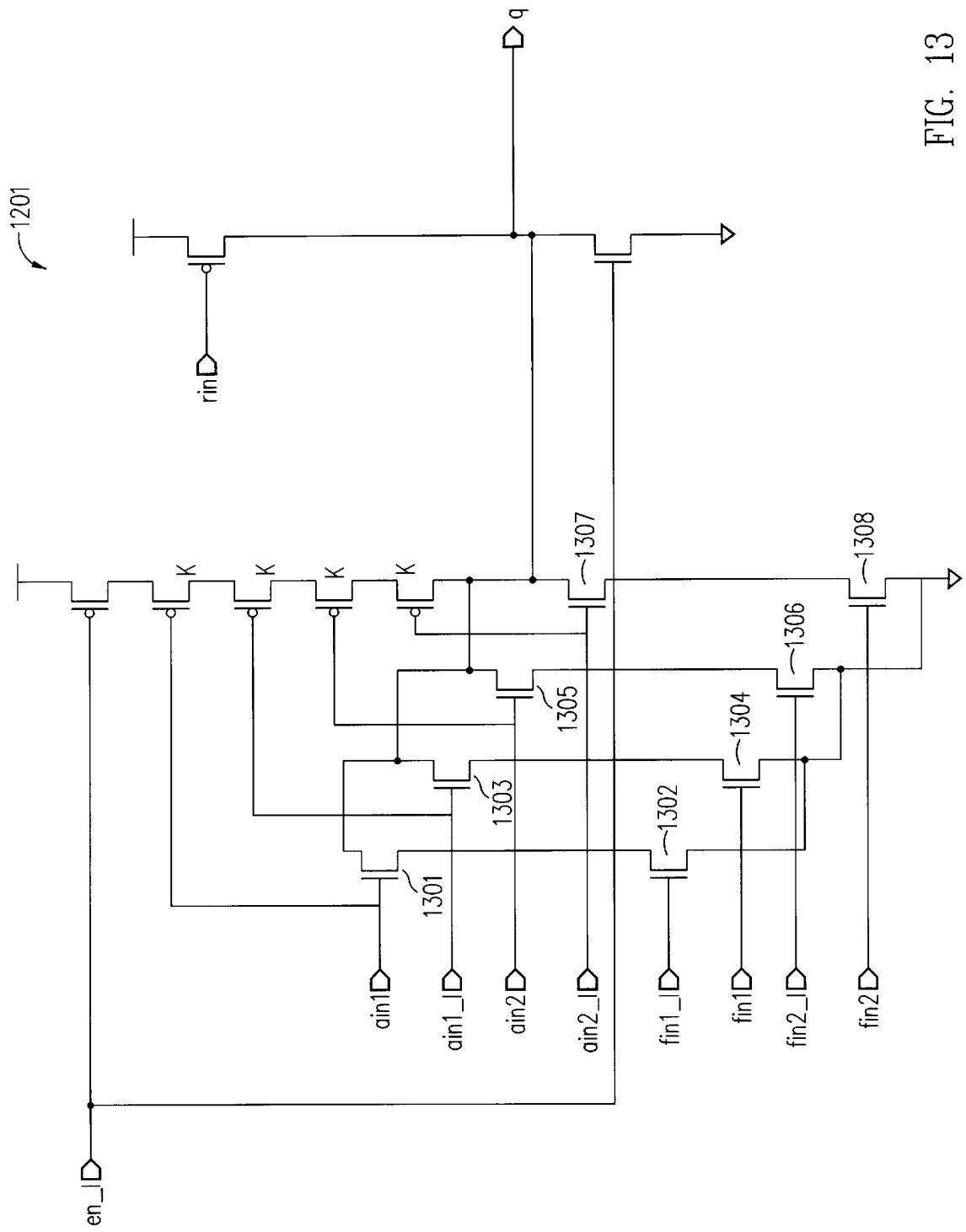
FIG. 13 is a circuit diagram of a two-bit, bitwise dynamic NOT comparator circuit in accordance with an embodiment of the present invention.

Referring now to FIGS. 12–16, an embodiment of the NOT comparator based enable circuit 450 (see FIG. 4) is now described. In FIG. 12, left and right halves of NOT comparator based enable circuit 450 respectively receive failed row address 0 (i.e., fin∅<0:7> and fin∅__1<0:7>) and failed row address 1 (i.e., fin1<0:7> and fin1__1<0:7>) for bitwise comparison with the row address (i.e., ain<0:7> and ain__1<0:7>) supplied to memory array 202. True and complement versions of each address are supplied from the input register. Each half of the circuit of FIG. 12 includes four instances of bitwise dynamic NOT comparator circuit 1201 (see FIG. 13) which supply low on respective lines q if there is a bit mismatch between any bit of failed row address and the corresponding bit of the row address supplied to memory array 202. Only if each of the corresponding bits of failed row address and the row address match does line q not discharge through a pair of n-channel FETs (e.g., 1301 and 1302, 1303 and 1304, 1305 and 1306, or 1307 and 1308). P-channel FET keepers K keep node q static when no address is activated, i.e., when both ainX and ainX__1 {X=1,2} are low. Of course, the number of OR'ed groups can vary. FIG. 13 depicts a 2-bit group, although a 4-bit version would also be suitable. Line rin controls precharge of line q and line en__1, which is coupled to the appropriate redundancy enabled input (e.g., reden∅ for redundant row 0 and reden1 for redundant row 1), kills any mismatch signals on lines q if redundancy is not enabled.

Figure 14:
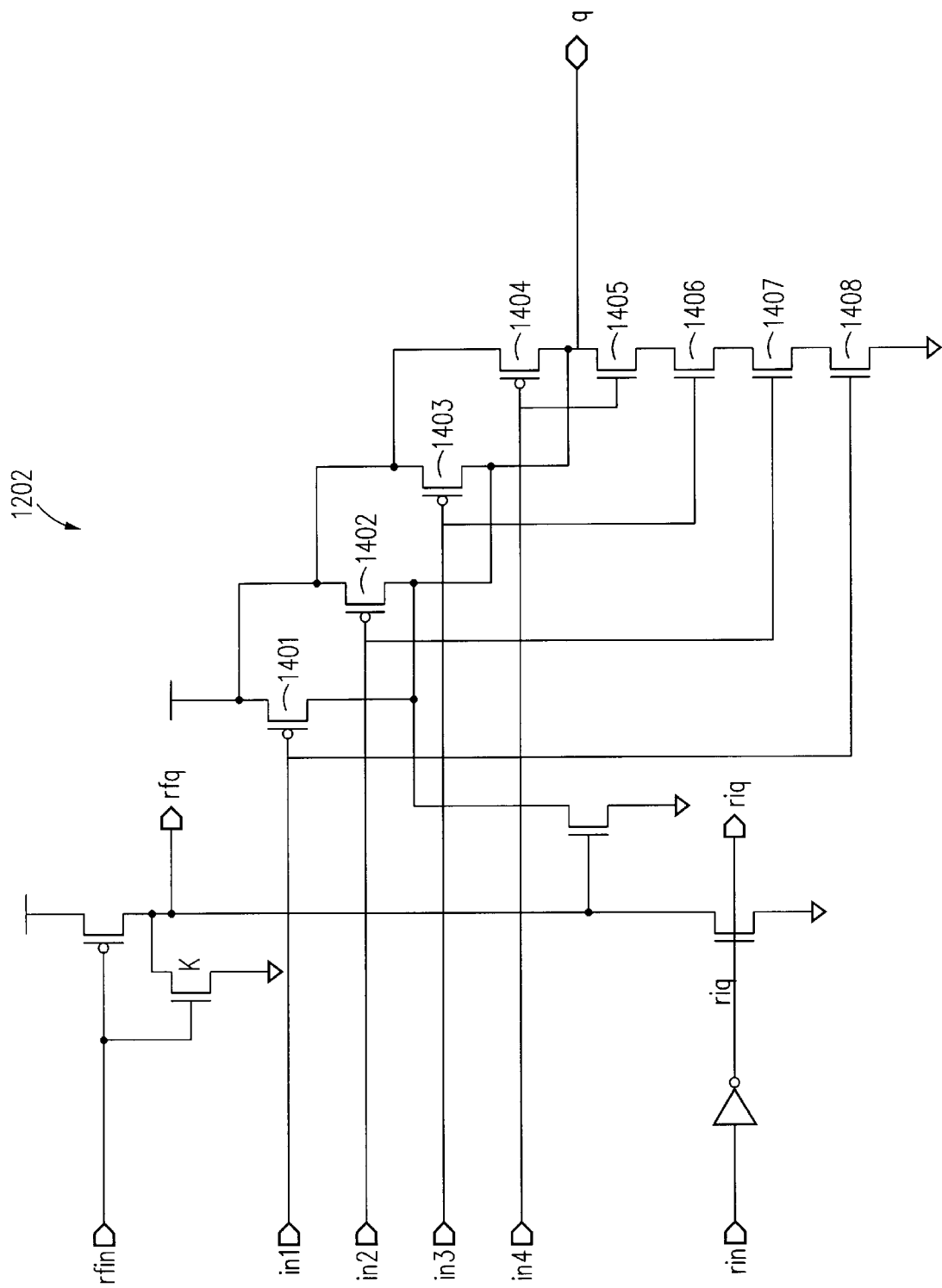
FIG. 14 is a circuit diagram of a second stage of dynamic logic for combining outputs of multiple bitwise dynamic NOT comparator circuits in accordance with an embodiment of the present invention.
Figure 15:
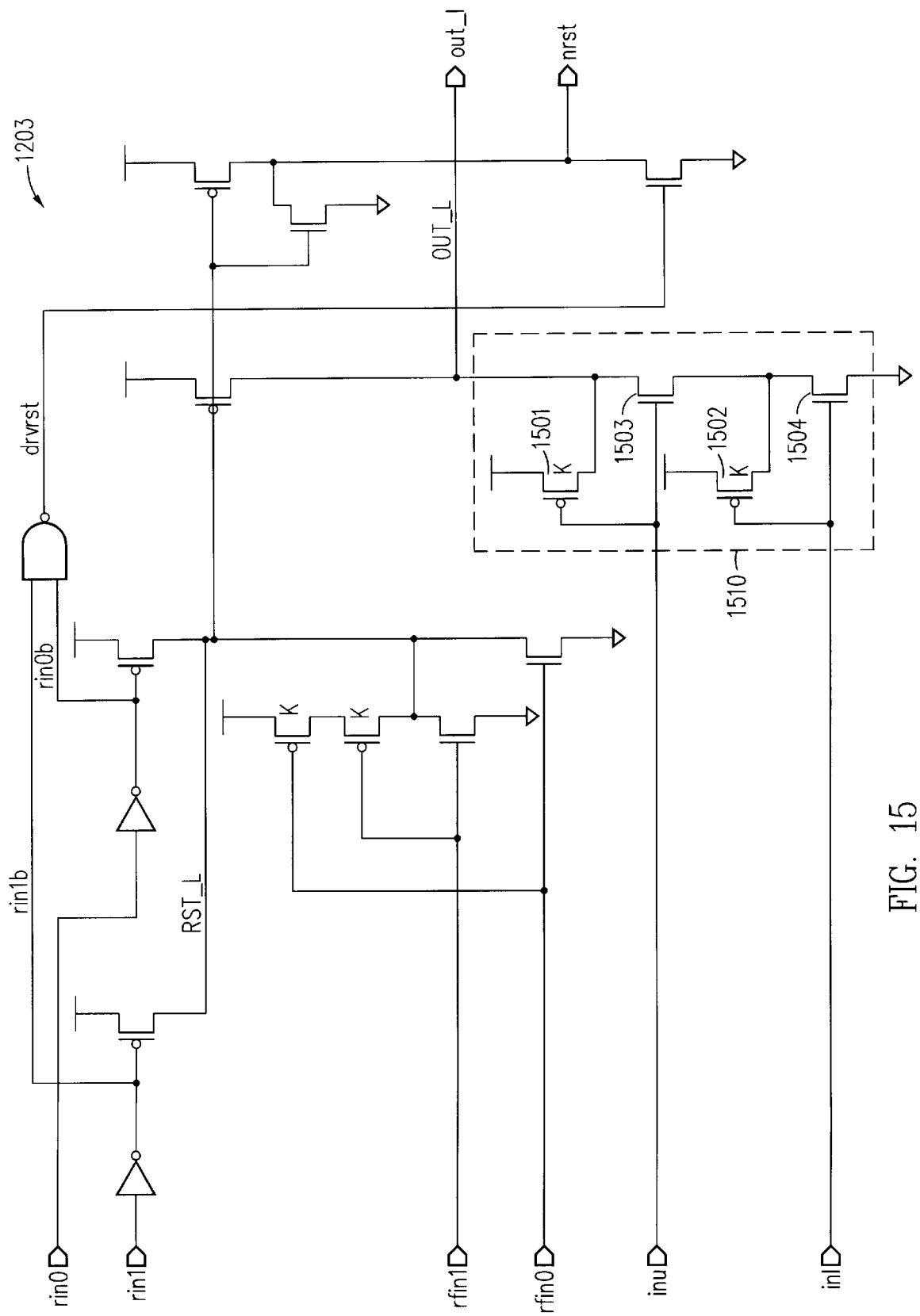
FIG. 15 is a circuit diagram of a third stage of dynamic logic for combining NOT comparison outputs associated with bitwise dynamic NOT comparison for a pair of redundant row addresses in accordance with an embodiment of the present invention.
Figure 16:
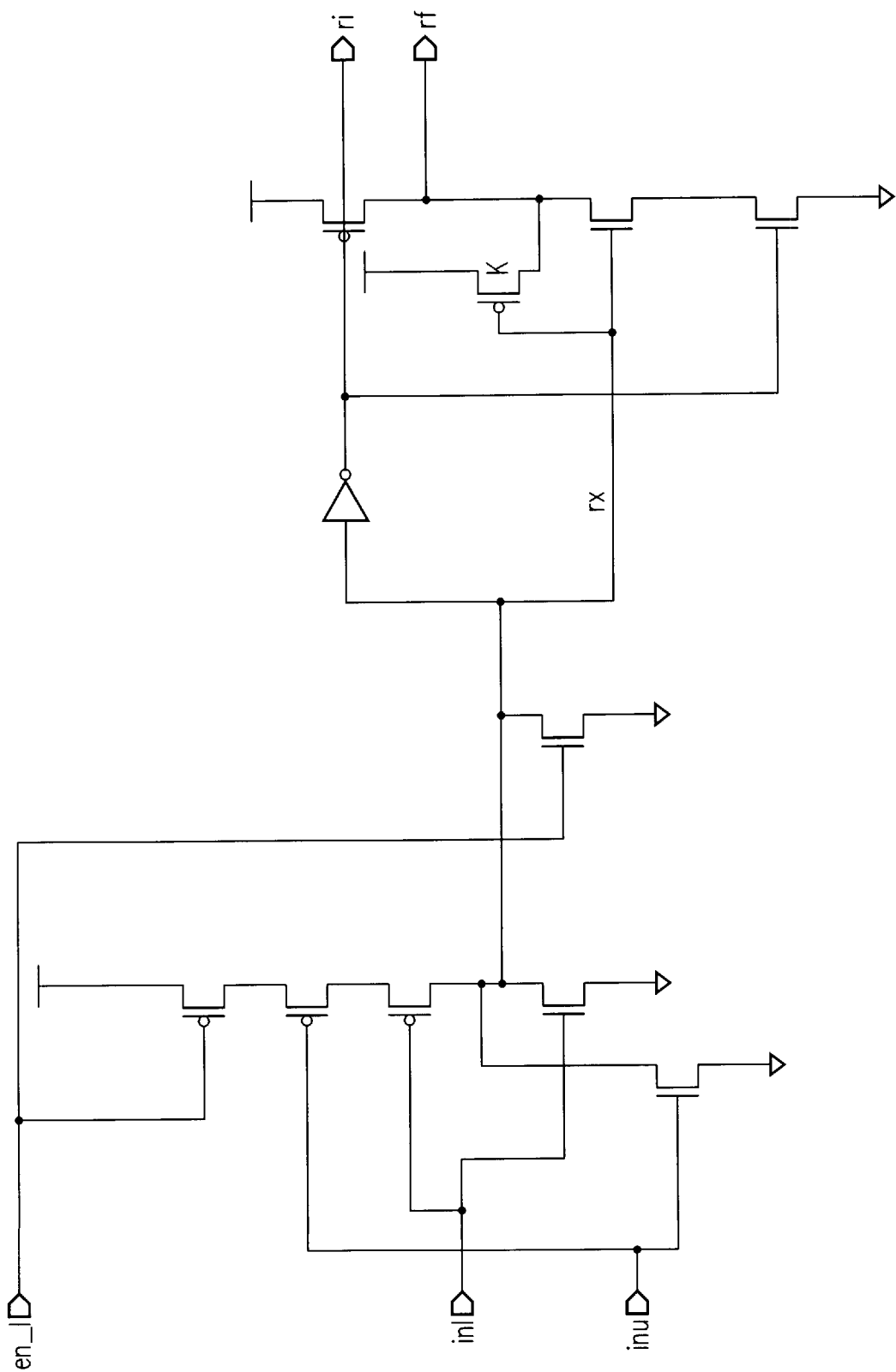
FIG. 16 depicts reset circuits of the dynamic NOT comparator of FIG. 12 in accordance with an embodiment of the present invention.

Referring now to FIG. 14, output lines q of the four instances of bitwise dynamic NOT comparator circuit 1201 in turn supply lines in1, in2, in3, and in4 of the CMOS NAND circuit formed by p-channel FETs 1401, 1402, 1403, and 1404 and n-channel FETs 1405, 1406, 1407, and 1408. Lines rfin and rin supply circuit reset signals and propagate reset signals to the final stage 1203 of NOT comparator based enable circuit 450 which is show in detail in FIG. 15. P-channel FETs 1501 and 1502 together with n-channel FETs 1503 and 1504 form a NAND circuit 1510 whose output corresponds to that of AND gate 405 (FIG. 4) and which, considered in light of the previously described stages, supplies an enable signal on line out__1 to normal row predecode logic 404A if any one of the bits of failed row address 0 and any one of the bits of failed row address 1 fail to match the corresponding bit of the row address supplied to memory array 202. In the circuit of FIG. 15, the upper row input (line inu) should be activated before the lower row input (line inl) in order to precharge line out__1 substantially to $V_{DD}$. In one embodiment in accordance with the present invention, a built-in self-test (BIST) controller enables the inu redundant row in cases where only single redundant row is exploited. BIST is described in greater detail in a described in greater detail in a co-pending patent application entitled, "Register-Based Redundancy Circuit and Method for Built-in Self-Repair in a Semiconductor Memory Device," <atty. docket no.: M-5140 US>naming Imtiaz P. Shaik, Dennis L. Wendell, John C. Holst, Donald A. Draper, Amos Ben-Meir, and John G. Favor as inventors and filed on even date herewith, the entirety of which is hereby incorporated by reference.

Operation of reset and recovery circuits paths via rednerec 1204 and 1205, through 1202 and 1203, and on to the normal row predecoder are as described above with reference to FIG. 7A and 7B. Ideally, recovery would be performed after all inputs are recovered low. However, with 8 true and 8 complement inputs, a 16 input gate would be required. Since either true or complement of a given bit is guaranteed to be high, one bit (bit 5 or bit 7) is used to trigger the respective recovery circuits.

Figure 17A:
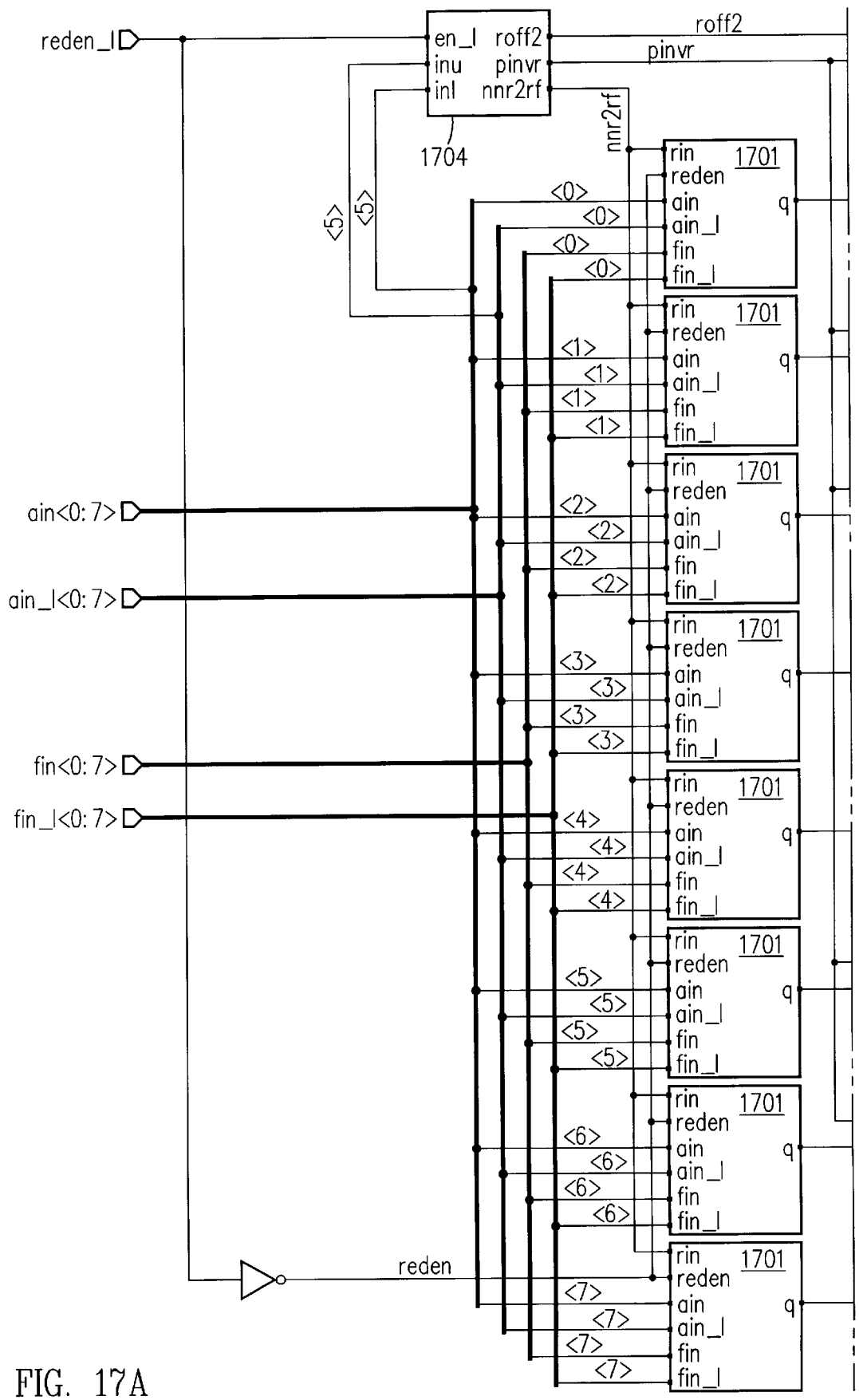
FIG. 17 depicts an organization of a dynamic TRUE comparator, in accordance with an embodiment of the present invention, for supplying redundant row predecode circuits with an enable signal when an addressed row matches a failed row address.
Figure 18:
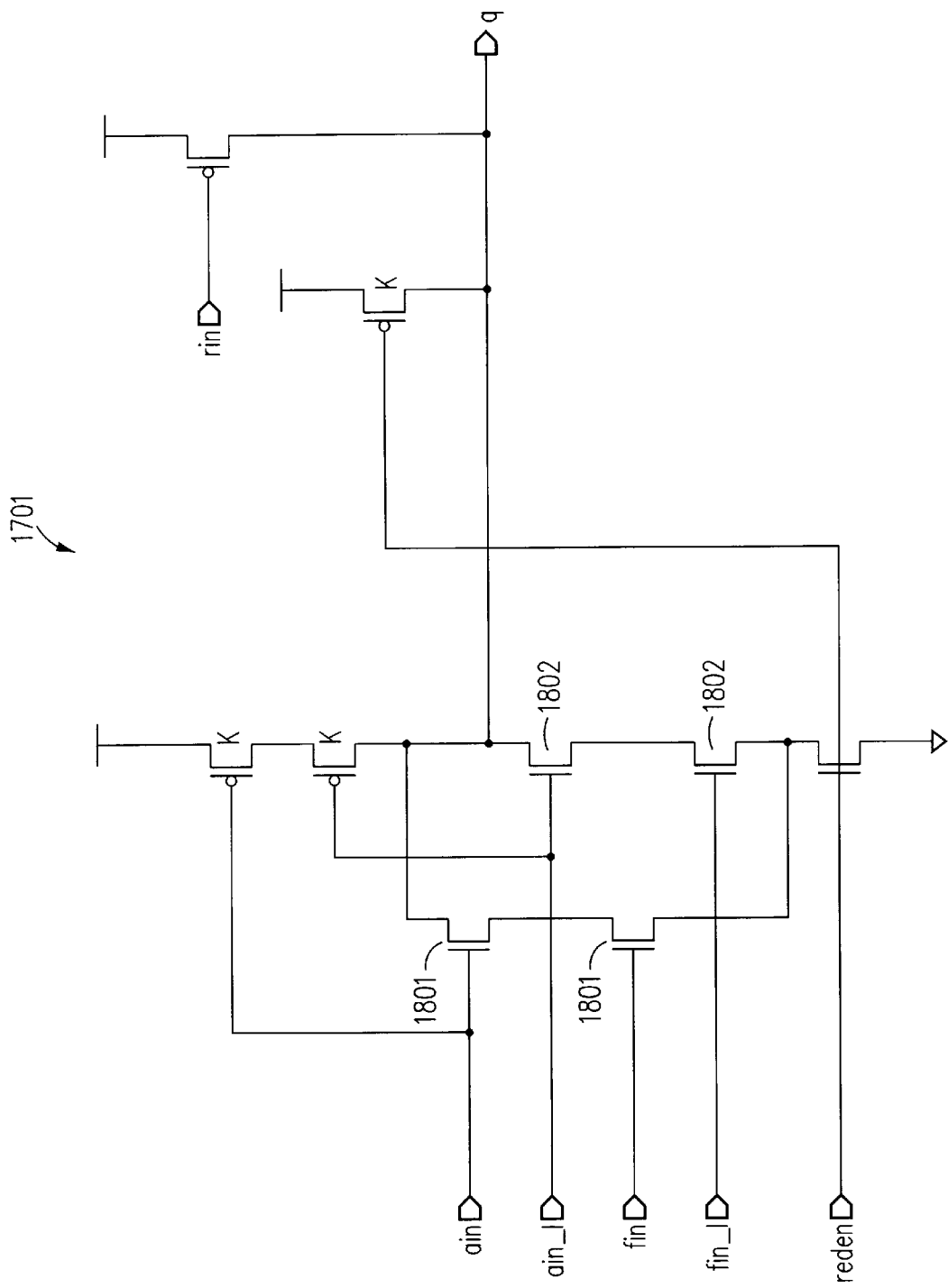
FIG. 18 is a circuit diagram of a bitwise dynamic TRUE comparator circuit in accordance with an embodiment of the present invention.

Referring now to FIGS. 17–22, an embodiment of the TRUE comparator based enable circuits 402A and 402B (see FIG. 4) is now described. Although a single instance is now described, it will be understood that multiple instances are envisioned, each corresponding to a redundant row and each comparing the corresponding failed row address to the row address supplied to memory array 202. In FIG. 17, true and complement versions of the failed row address (i.e., fin<0:7> and fin_1<0:7>) and of the row address (i.e., ain<0:7> and ain_1<0:7>) are supplied to instances 1701 of two-bit dynamic TRUE comparator circuits. Outputs of pairs of the two-bit dynamic TRUE comparator circuit 1701 instances supply NOR circuits 1702, pairs of which in turn supply AND circuits 1703. The two instances of AND circuit 1703 in turn supply most and least significant bits of a redundant row enable signal for redundant row predecoder 404A (FIG. 4).

The eight instances of bitwise dynamic TRUE comparator circuit 1701 (see FIG. 18) supply low on respective lines q if there is a bit match between a bit of the failed row address and the corresponding bit of the row address supplied to memory array 202. Only if the corresponding bits of the failed row address and the row address mismatch does line q fail to discharge through a pair (1801 or 1802) of series coupled n-channel FETs. Line rin pulls output line q high on a reset signal. Line reden, which is coupled to the appropriate redundancy enabled input (e.g., reden∅ for redundant row 0 and redenl for redundant row 1), decouples the pairs 1801 and 1802 of series coupled FETs from the discharge path and charges (or maintains) line q high, thereby killing any match signal on lines q if redundancy is not enabled.

Figure 19:
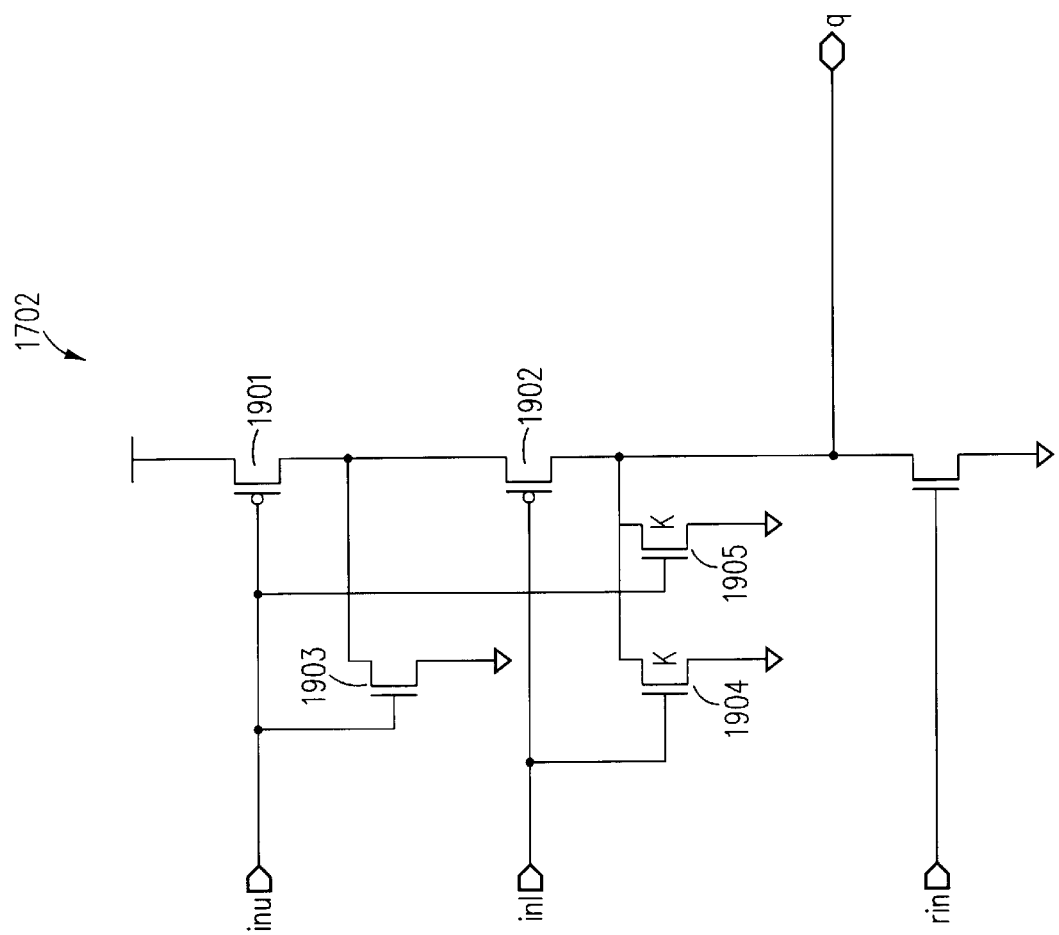
FIG. 19 is a circuit diagram of a second stage of dynamic logic for combining outputs of multiple bitwise dynamic TRUE comparator circuits in accordance with an embodiment of the present invention.
Figure 20:
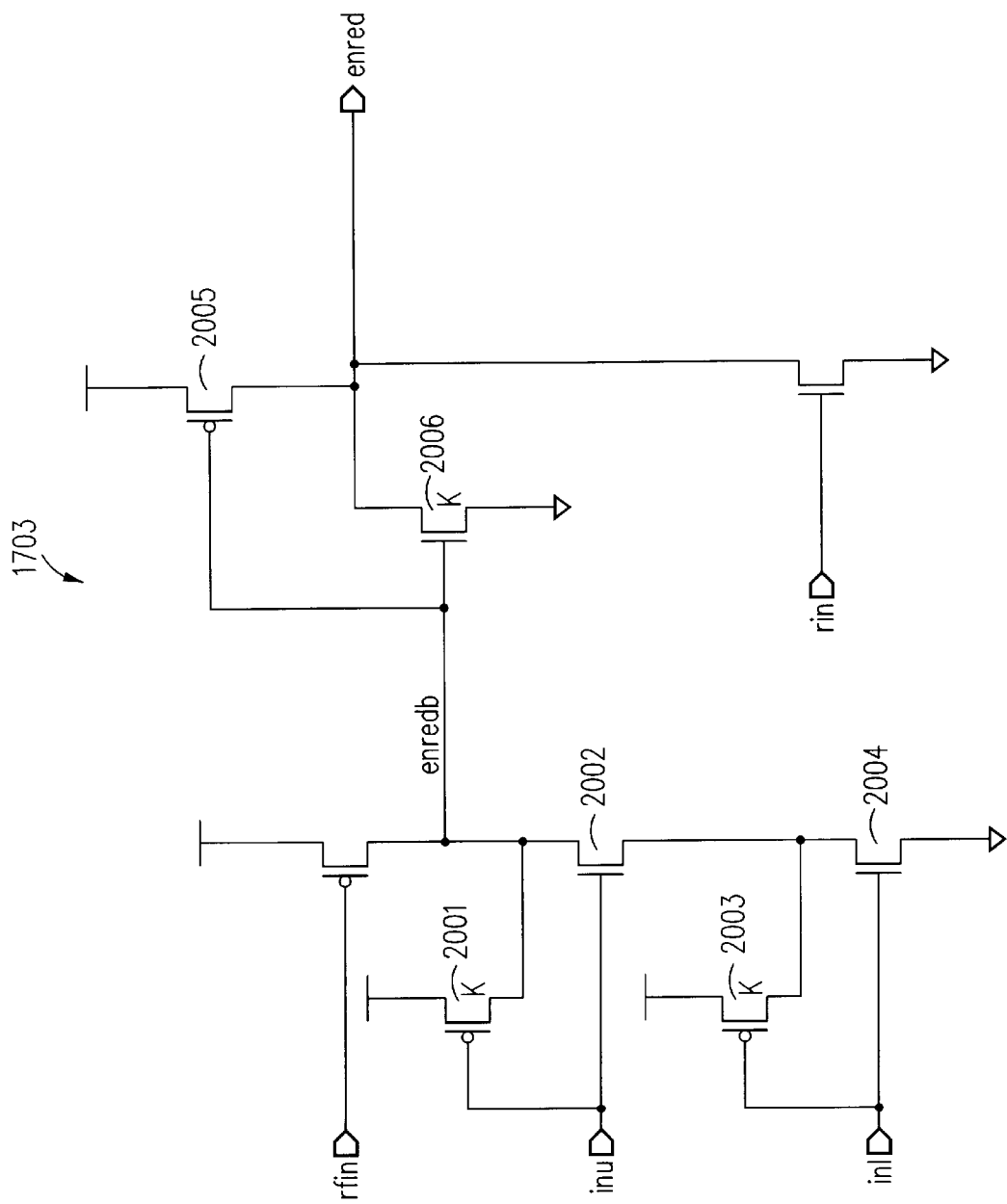
FIG. 20 is a circuit diagram of a third stage of dynamic logic for combining outputs of second stage circuits in accordance with an embodiment of the present invention.
Figure 21:
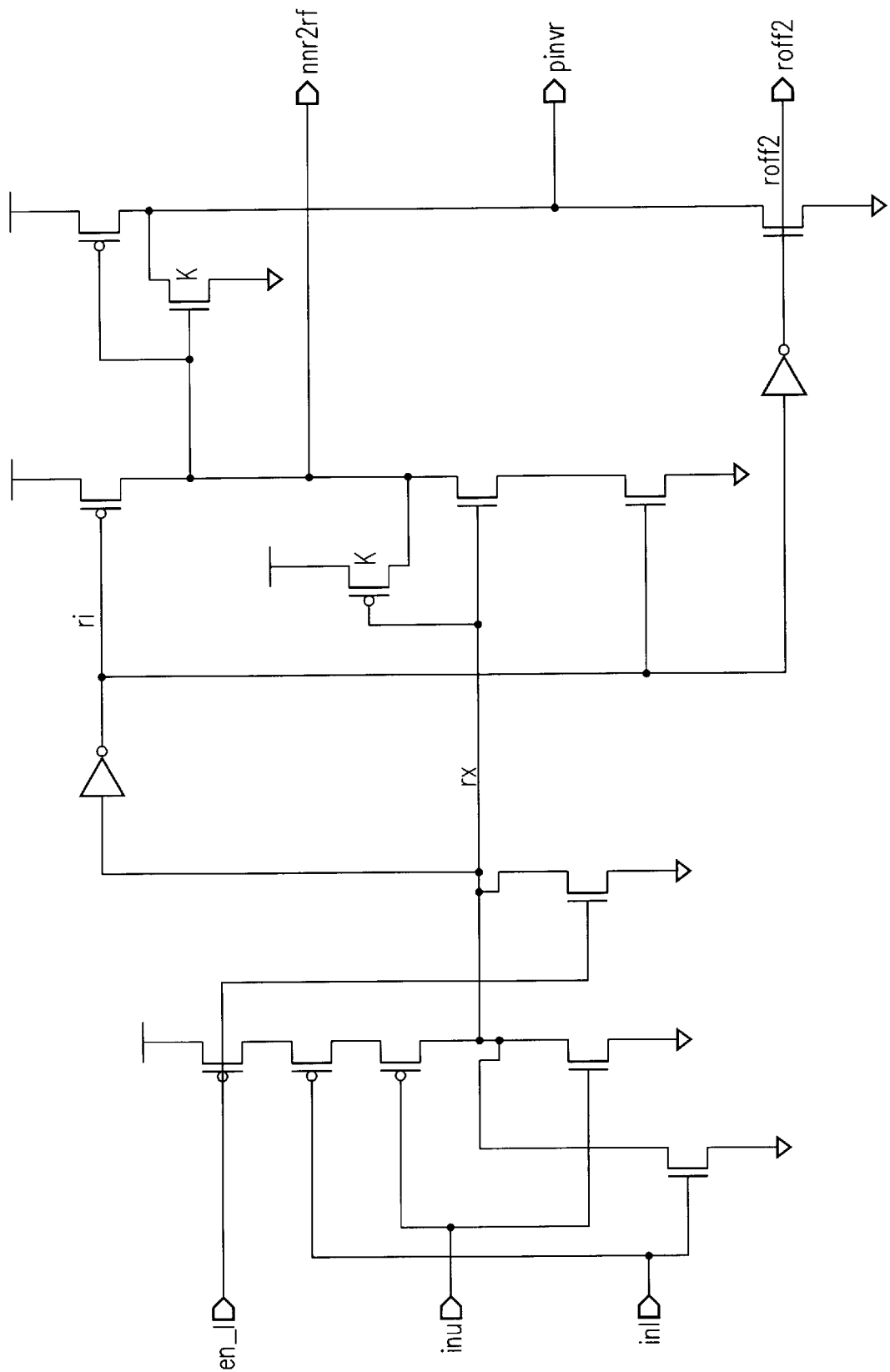
FIGS. 21 and 22 depict reset circuits of the dynamic TRUE comparator of FIG. 17 in accordance with an embodiment of the present invention.
Figure 22:
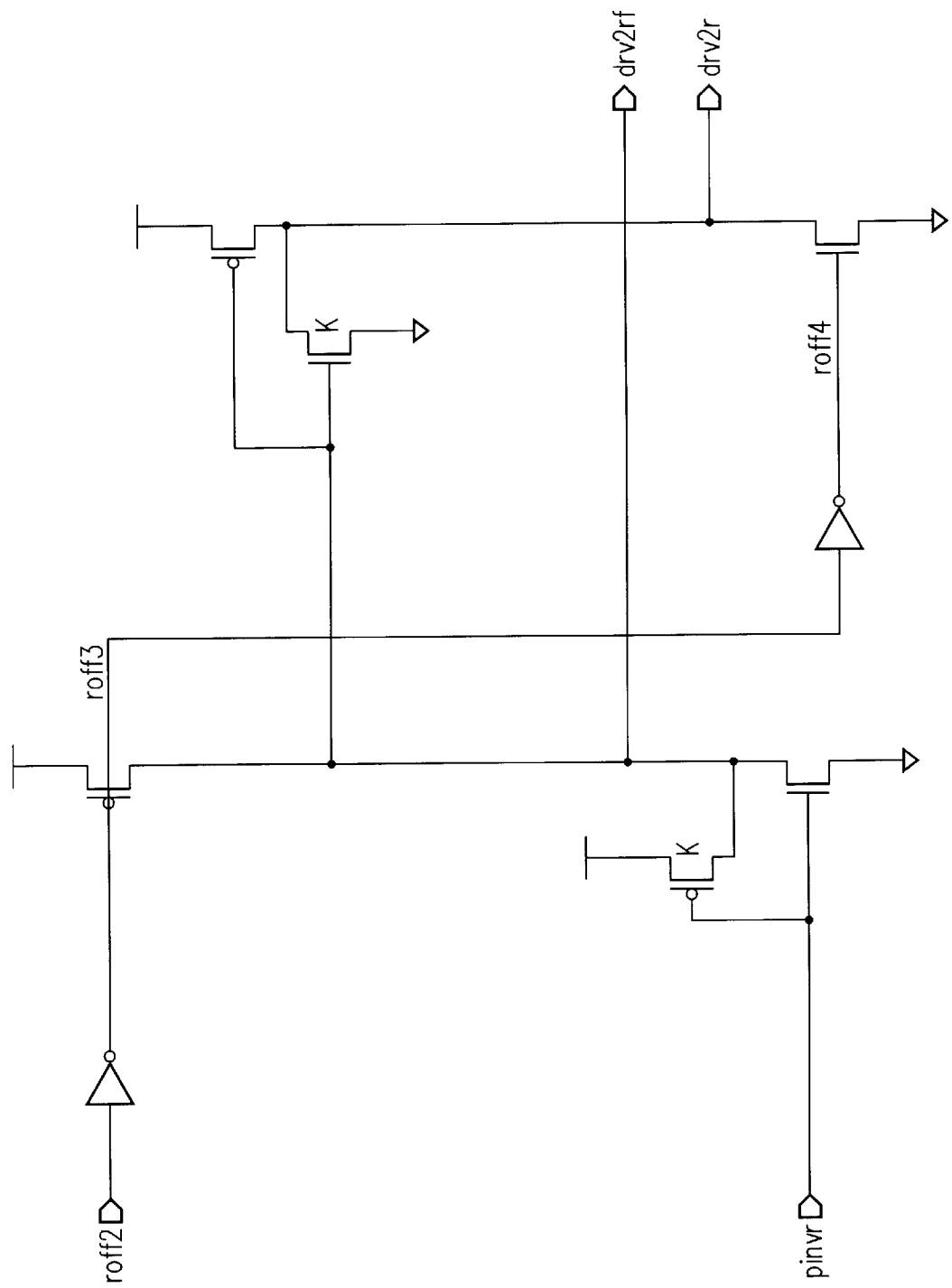

Referring now to FIG. 19, output lines q of the eight instances of bitwise dynamic TRUE comparator circuit 1701 in turn supply lines inu, and inl of the CMOS NOR circuit 1702 formed by FETs 1901–1905. Line rin pulls output line q low on a reset signal. Output lines q of the 4 instances of NOR circuit 1702 in turn supply lines inu, and inl of a pair of AND circuit 1703 instances. As depicted in FIG. 20, coupled NAND (FETs 2001–2004) and NOT (FETs 2005 and 2006) circuits supply enable line enred.

Regarding terminology used herein, it will be appreciated by one skilled in the art that any of several expressions may be equally well used when describing the operation of a circuit including the various signals and nodes within the circuit. Any kind of signal, whether a logic signal or a more general analog signal, takes the physical form of a voltage level (or for some circuit technologies, a current level) of a node within the circuit. It may be correct to think of signals being conveyed on wires or buses. For example, one might describe a particular circuit operation as "the output of circuit 10 drives the voltage of node 11 toward VDD, thus asserting the signal OUT conveyed on node 11." This is an accurate, albeit somewhat cumbersome expression. Consequently, it is well known in the art to equally describe such a circuit operation as "circuit 10 drives node 11 high," as well as "circuit 10 pulls the OUT signal high" and "circuit 10 drives OUT high." Such shorthand phrases for describing circuit operation are just as clear and much easier to quickly communicate details of circuit operation without becoming lost in needless prepositional phrases, particularly because the schematic diagrams in the figures clearly associate various signal names with the corresponding circuit blocks and node names. For convenience, an otherwise unnamed node conveying the CLK signal may be referred to as the CLK node. Similarly, phrases such as "pull high," "drive high," and "charge" are generally synonymous unless otherwise distinguished, as are the phrases "pull low," "drive low," and "discharge." It is believed that use of these more concise descriptive expressions enhances clarity and teaching of the disclosure, even though they are admittedly more colloquial in style. It is to be appreciated by those skilled in the art that each of these and other similar phrases may be interchangeably used to describe common circuit operation, and no subtle inferences should be read into varied usage within this description.

As an additional example, a logic signal has an active level and an inactive level (at least for traditional binary logic signals) and the active and inactive levels are sometimes also respectively called active and inactive "states." The active level for some logic signals is a high level (i.e., an "active-high" signal) and for others is a low level (i.e., an "active-low" signal). A logic signal is "asserted" or "activated" when driven to the active level. Conversely, a logic signal is "de-asserted" or "de-activated" when driven to the inactive level. Frequently logic signals are named in a fashion to convey which level is the active level. For example, CLKEN is commonly used to name an active-high clock enable signal, because the true polarity is implied in the name. Conversely, /CLKEN, CLKENB, CLKEN#, CLKEN*, CLKEN_L, CLKEN_C, or #CLKEN are commonly used to name an active-low clock enable signal, because one of the many common expressions indicating the complement polarity is used in the name. Complementary pairs of signals or node names, such as true and complement clock lines, and true and complement bit lines within a column of a memory array, are frequently named to clarify the polarity of both nodes or signals (e.g., BL3T and BL3C; BL6_T and BL6_C) and in other instances, only the complement polarity may be indicated in the names (e.g., CLK and CLK#). In still other cases, two "complementary" signals are both inactive at one state (e.g., inactive low), and only one is driven to an active level to convey the polarity of the signal. For example, two complementary address lines (e.g., A2T and A2C) are both inactive low during a quiescent portion of a cycle. Later, A2T is driven high to indicate that the received address A2 is high (A2=H). Alternatively, A2C is driven high to indicate that the address received is low (A2=L). It is to be appreciated by those skilled in the art that these and other similar phrases may be used to name the signals and nodes. The schematic diagrams and accompanying description of the signals and nodes should in context be clear.

Regarding power supplies, a single positive power supply voltage (e.g., a 3.3 volt power supply) used to power a circuit is frequently named the "VDD" power supply. In an integrated circuit, transistors and other circuit elements are actually connected to a VDD terminal or a VDD node, which is then operably connected to the VDD power supply. The colloquial use of phrases such as "tied to VDD" or "connected to VDD" is understood to mean "connected to the VDD node", which is typically then operably connected to actually receive the VDD power supply voltage during use of the integrated circuit.

The reference voltage for such a single power supply circuit is frequently called "VSS." Transistors and other circuit elements are actually connected to a VSS terminal or a VSS node, which is then operably connected to the VSS power supply during use of the integrated circuit. Frequently the VSS terminal is connected to a ground reference potential, or just "ground." Describing a node which is "grounded" by a particular transistor (unless otherwise defined) means the same as being "pulled low" or "pulled to ground" by the transistor.

While the invention has been described in light of the embodiments discussed above, one skilled in the art will recognize that certain substitutions may be easily made in the circuits without departing from the teachings of this disclosure. For example, a variety of logic gate structures may be substituted for those shown, and still preserve the operation of the circuit. In particular, a NAND gate may be replaced by a NOR gate by appropriate polarity changes of the various signals, in accordance with DeMorgan's law.

Moreover, an inverted output of a flip-flop may be used rather than the non-inverted output, again appropriate polarity changes of the various signals. Also, many circuits using NMOS transistors may be implemented using PMOS transistors instead, as is well known in the art, provided the logic polarity and power supply potentials are reversed. In this vein, the transistor conductivity-type (i.e., N-channel or P-channel) within a CMOS circuit may be frequently reversed while still preserving similar or analogous operation.

Processor and System Embodiments

The register based redundancy circuit and method for built-in self-repair in accordance with the present invention can be used in variety of circuits and devices incorporating semiconductor memory. For example, FIG. 1 depicts an exemplary x86 instruction-set compatible integrated circuit microprocessor 100. Instructions obtained from a processor system bus interface 130 are pre-decoded during filling of a level-one (L1) instruction cache 102 after which the predecode bits are stored in a predecode cache 135. Integrated circuit microprocessor 100 decodes up to two x86 instructions per clock from instruction cache 102. Most of the x86 instructions are directly translated by hardware of dual instruction decoders 104 into one to four RISC-like operations, called RISC86 Ops. Other complex or uncommon instructions are mapped into ROM-resident sequences of RISC Ops using emulation code ROM translation. An instruction scheduler 106 buffers up to 24 RISC86 operations, using register renaming with a total of 48 registers. Up to six RISC86 instructions are issued out-of-order to seven parallel execution units, illustratively load unit 108, store unit 110, integer X unit 112, multimedia unit 114, integer Y unit 116, floating point unit 118, and branch unit 120. RISC86 instructions are speculatively executed and retired in order. Microprocessor 100 also includes level-one (L1) dual-port data cache 122.

Data, instruction and predecode cache sizes are 32 KB, 32 KB and 20 KB, respectively, constructed from macro building blocks of 8 KB and 10 KB. Time multiplexing allows 1 read and 1 write per cycle. A 4×64 bit write eviction buffer is included in each data cache macro. The predecode macro includes the first stage of instruction decode logic. Bypass and storage buffer for data, instruction and predecode are provided of size 4×16, 4×16 and 2×40 bits, respectively, allowing data-in to flow back to the cache outputs. Table 1 details attributes of the caches.

In the embodiment of FIG. 1, both instruction cache 102 and data cache 122 exhibit the following basic features: 32 KB size; 2-way set associativity; 64-byte line size with 32-byte sub-blocking; cache fills on a subblock basis; virtual indexing (only bits [13:12] of the index address are virtual) and physical tagging. Synonyms/aliasing are handled in hardware; hit under miss is supported, and mutual exclusion as between instruction cache 102 and data cache 122 is supported. This eases the handling of self modifying code. To clarify the terminology: There are 256 sets in each cache. Each set contains two-ways (or lines) and each line contains two sub-blocks. The result is a 256×2×64, or 32 KB cache.

A level-one cache controller 140 controls caching in instruction cache 102. Instruction cache 102 uses a most recently used scheme (MRU) to predict the way selection on cache accesses. A misprediction in the way selection causes a one cycle penalty. Instruction cache 102 uses a least recently used (LRU) line replacement algorithm. An alternative random replacement algorithm is supported through a configuration bit. Instruction cache 102 also supports a direct-mapped replacement algorithm, although using the configuration reduces the cache size from 32 KB to 16 KB. Instruction cache 102 performs a simple prefetching algorithm. When a line miss occurs, as distinguished from a sub-block miss, and the miss is on sub-block 0 of the line (bit [5] of the address is 0), then both sub-blocks are fetched and pipelined on the bus.

The data cache 122 includes a 128-entry data translation lookahead buffer (DTLB). In contrast to instruction cache 102, the data cache 122 uses a least recently missed (LRM) selection technique which is generally a more accurate selection scheme than the LRU technique. In the LRM scheme, the line that first enters the cache is replaced. An alternative random replacement algorithm is also supported. The data cache 122 also supports a direct-mapped replacement algorithm, reducing the cache size from 32 KB to 16 KB.

The RISC86 Op scheduler 106, under control of an instruction control unit 150, issues up to six RISC86 operations using out-of-order issuing to seven parallel execution units. The execution units speculatively execute the RISC86 Ops to generate results. The RISC86 Op scheduler 106 retires the results in order. Branch unit 120 implements a branch prediction operation that uses two-level branch prediction based on an 8192-entry branch history table (BHT), a 16-entry branch target cache (BTC), and a 16-entry return address stack (RAS).

The dual instruction decoders 104 translate x86 instructions on-the-fly into corresponding RISC86 Ops. The RISC86 Ops are executed by an instruction core that is essentially a RISC superscalar processing or execution engine. The fetch logic fetches up to sixteen instruction bytes each cycle from instruction cache 102 and transfers the instruction bytes into an instruction buffer (not shown) preceding the dual instruction decoders 104 so that the instruction buffer is maintained at capacity. The dual instruction decoders 104 access the instruction bytes from the instruction buffer, decode up to two x86 instructions, immediately recognize and predict branches, and generate up to four RISC86 Ops. The RISC86 Ops are loaded into the unified RISC86 Op scheduler 106. The RISC86 Op scheduler 106 controls and tracks multiple aspects of RISC86 Op issue and execution.

The load unit 108 loads data via data cache 122 which receives data from an external memory (not shown) via the processor system bus interface 130. Bypass (not shown) and storage buffers (not shown) for data (4×16) to the data cache 122 are supplied to allow data-in and data flow-back to cache output terminals.

A wide variety of computer system configurations are envisioned, each embodying the above-described register based redundancy circuit and method for built-in self-repair in accordance with the present invention. For example, one such a computer system includes integrated circuit microprocessor 100 with instruction, data and predecode caches having register based redundancy circuits for built-in self-repair in accordance with the present invention, a memory subsystem (e.g., RAM), a display adapter, disk controller/adapter, various input/output interfaces and adapters, and corresponding external devices. Memory, adapters and interfaces are conventionally coupled to integrated circuit microprocessor 100 (e.g., via busses).

While the invention has been described with reference to various embodiments, it will be understood that these embodiments are illustrative and that the scope of the invention is not limited to them, Many variations, modifications, additions, and improvements of the embodiments described are possible. Structures and functionality presented as hardware in the exemplary embodiment may be implemented as software, firmware, or microcode in alternative embodiments. These and other variations, modifications, additions, and improvements may fall within the scope of the invention as defined in the claims which follow.

What is claimed is:

1. A semiconductor memory having a matrix of memory elements including normal memory elements and redundant memory elements, said semiconductor memory comprising:
   a row predecode circuit including an enable node;
   redundant row selection circuitry comprising:
      a dynamic logic circuit implementing an N-bit wide NOT comparator coupled into a row address path of said semiconductor memory and coupled to supply said enable node with an enable signal if at least one of N row address bits mismatch a corresponding bit of a failed row address; and
      a logic circuit implementing an N-bit wide TRUE comparator coupled into said row address path to supply a decode signal selective for a redundant row if all of said N row address bits match corresponding bits of said failed row address.

2. A semiconductor memory, as recited in claim 1, further comprising:
   a row redundancy encoding corresponding to said redundant row and coupled to said NOT and said TRUE comparators to supply said failed row address.

3. A semiconductor memory, as recited in claim 2, wherein said row redundancy encoding comprises volatile storage initializable by built-in self-test logic.

4. A semiconductor memory, as recited in claim 2, wherein said row redundancy encoding comprises a fuse or anti-fuse.

5. A semiconductor memory, as recited in claim 2, wherein said row redundancy encoding comprises a floating gate MOSFET.

6. A semiconductor memory, as recited in claim 1, wherein said NOT and said TRUE comparators are coupled to enable said row predecode circuit and a redundant row predecode circuit, respectively; and
   wherein said row predecode circuit and said redundant row predecode circuit each couple to main row decode circuits to drive a selected word line of said matrix, said selected word line being selected by one of said row predecode circuit and said redundant row predecode circuit.

7. A semiconductor memory, as recited in claim 1, wherein said TRUE comparator is implemented in dynamic logic.

8. A semiconductor memory, as recited in claim 1, wherein said dynamic logic of said NOT comparator is responsive to a redundancy enable signal, said NOT comparator having negligible impact, when said redundancy enable signal is not asserted, on access time for said normal memory elements.

9. A semiconductor memory, as recited in claim 1, forming one of a data cache, an instruction cache, and a predecode cache of a integrated circuit microprocessor, said redundant row selection circuitry improving effective manufacturing yield of said integrated circuit microprocessor.

10. A semiconductor memory, as recited in claim 1, forming one of a data cache, an instruction cache, and a predecode cache of a integrated circuit microprocessor, said redundant row selection circuitry operable for self-repair of post shipment memory element failures.

11. A method for providing redundancy in a semiconductor memory integrated circuit having normal rows and at least one redundant row, said method comprising:
   in response to a row address presented to said semiconductor memory, simultaneously performing in dynamic logic, TRUE and NOT comparisons of said presented row address with a failed row address;
   (a) enabling, in response to an affirmative NOT comparison, predecode logic associated with said normal rows; and
   (b) enabling, in response to an affirmative TRUE comparison, predecode logic associated with said at least one redundant row,
wherein said NOT comparison is performed independently of said TRUE comparison such that timing of said (a) enabling is substantially unaffected by said TRUE comparison.

12. A method, as recited in claim 11, wherein said (a) enabling is performed in dynamic non-clocked logic of said semiconductor memory integrated circuit.

13. A method, as recited in claim 11, further comprising:
   initializing, with built-in self-test logic, volatile storage to encode said failed row address; and
   supplying said failed row address from said volatile storage.

14. An integrated circuit chip comprising:
   an array of semiconductor memory elements including normal and redundant memory elements;
   a rewritable on chip encoding to encode a failed address corresponding to a redundant group of said redundant memory elements;
   a TRUE comparator circuit coupled to select said redundant group when an address supplied to said array corresponds to said failed address; and
   a dynamic NOT comparator circuit coupled to enable address decode circuits when said address does not correspond to said failed address.

15. An integrated circuit chip, as recited in claim 14, wherein said redundant group comprises a redundant word line of redundant memory elements.

16. An integrated circuit chip, as recited in claim 14, wherein said redundant group comprises a redundant row of redundant memory elements.

17. An integrated circuit chip, as recited in claim 14, wherein said redundant group comprises a redundant column of redundant memory elements.

18. An integrated circuit chip, as recited in claim 14, wherein said integrated circuit chip comprises an integrated circuit microprocessor chip with a cache memory block defining said array of semiconductor memory elements.

19. An integrated circuit chip, as recited in claim 14, wherein said integrated circuit chip comprises a memory chip with a memory block thereon defining said array of semiconductor memory elements.

20. An integrated circuit chip, as recited in claim 14, coupled into a computer system having a processor, a memory and a bus coupled therebetween, said packaged integrated circuit chip including circuits of at least one of said processor and said memory.

21. An apparatus comprising:
   a semiconductor memory array;
   row predecoder means coupled to at least partially decode a row address into said semiconductor memory array, said row predecoder means including a first enable terminal;

redundant row selection means including a second enable terminal;

NOT comparator means coupled into a row address path of said semiconductor memory and coupled to supply said first enable terminal with an enable signal if said row address mismatches a failed row address encoding; and TRUE comparator means distinct from said NOT comparator means and coupled into said row address path to supply via said redundant row selection means, a decode signal selective for a redundant row if said row address matches said failed row encoding.

* * * * *